United States Patent

Oshida et al.

Patent Number: 5,209,813
Date of Patent: May 11, 1993

[54] LITHOGRAPHIC APPARATUS AND METHOD

[75] Inventors: Yoshitada Oshida, Fujisawa; Genya Matsuoka, Ome; Teruo Iwasaki, Tokyo; Toshio Kaneko, Katsuta; Hiroyuki Takahashi, Yokohama; Hiroyoshi Ando, Katsuta; Hidenori Yamaguchi, Kokubunji; Katsuhiro Kawasaki, Katsuta, all of Japan

[73] Assignee: Hitachi, Ltd., Tokyo, Japan

[21] Appl. No.: 781,879

[22] Filed: Oct. 24, 1991

[30] Foreign Application Priority Data

| Oct. 24, 1990 | [JP] | Japan | 2-284244 |
| Oct. 26, 1990 | [JP] | Japan | 2-287008 |
| Dec. 1, 1990 | [JP] | Japan | 2-400009 |
| Jan. 30, 1991 | [JP] | Japan | 3-009612 |
| Mar. 29, 1991 | [JP] | Japan | 3-065973 |
| Apr. 18, 1991 | [JP] | Japan | 3-086542 |

[51] Int. Cl.$^5$ .................. B44C 1/22; B23K 15/00; G01J 4/00; G01B 11/06
[52] U.S. Cl. ................. 156/626; 156/643; 156/345; 219/121.19; 219/121.68; 219/121.83; 356/364; 356/382; 356/138
[58] Field of Search ............ 156/626, 627, 643, 657, 156/659.1, 662, 345; 356/364, 138, 139, 144, 375, 381, 382; 250/492.1, 492.2, 492.3; 219/121.19, 121.2, 121.23, 121.68, 121.69, 121.83

[56] References Cited

FOREIGN PATENT DOCUMENTS

| 52-139768 | 10/1977 | Japan . |
| 59-188931 | 10/1984 | Japan . |
| 61-77719 | 8/1986 | Japan . |
| 63-163833 | 7/1988 | Japan . |
| 1-170022 | 7/1989 | Japan . |
| 1-157423 | 10/1989 | Japan . |
| 1-167733 | 11/1989 | Japan . |
| 2-21553 | 1/1990 | Japan . |
| 2-6216 | 2/1990 | Japan . |
| 3-46220 | 2/1991 | Japan . |
| 3-46725 | 2/1991 | Japan . |
| 3-76212 | 4/1991 | Japan . |

Primary Examiner—William A. Powell
Attorney, Agent, or Firm—Antonelli, Terry, Stout & Kraus

[57] ABSTRACT

A lithographic method and a lithographic apparatus ar disclosed in which the height of a silicon wafer making up an object of lithography is accurately measured. A lithographic apparatus such as an electron beam apparatus having a height-measuring instrument built therein is effectively used for forming a pattern on the order of submicrons.

55 Claims, 22 Drawing Sheets

FIG. 1A
FIG. 1B
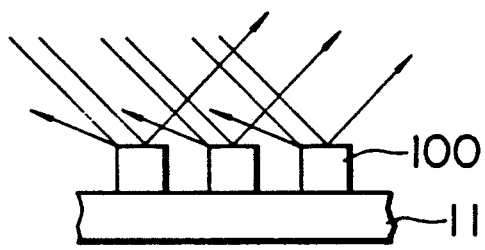
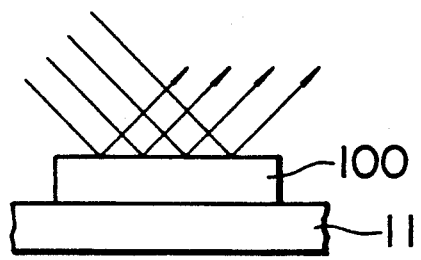
FIG. 2
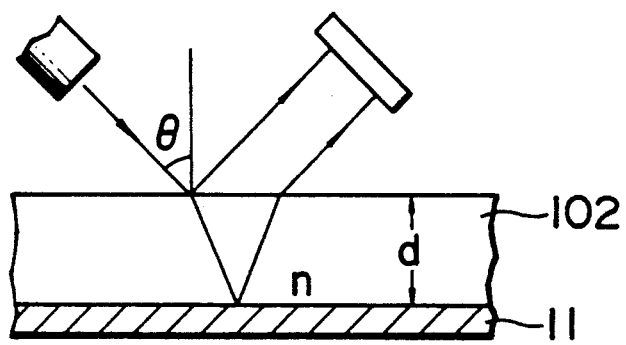

RELATIONSHIP BETWEEN RESIST THICKNESS AND DETECTION ERROR UPON DETECTION WITH P-POLARIZATION AT ANGLE 45° OF INCIDENCE

RELATIONSHIP BETWEEN RESIST THICKNESS AND DETECTION ERROR UPON DETECTION WITH S-POLARIZATION AT ANGLE 45° OF INCIDENCE

RELATIONSHIP BETWEEN RESIST THICKNESS AND DETECTION ERROR WITH (P+S) POLARIZATION AT ANGLE 45° OF INCIDENCE

RELATIONSHIP BETWEEN ANGLE $\theta$ OF INCIDENCE AND REFLECTANCE R ON TRANSMITTED OBJECT

INCIDENCE WITH P-POLARIZATION
AT ANGLE OF BREWSTER

OTHER THAN ABOVE

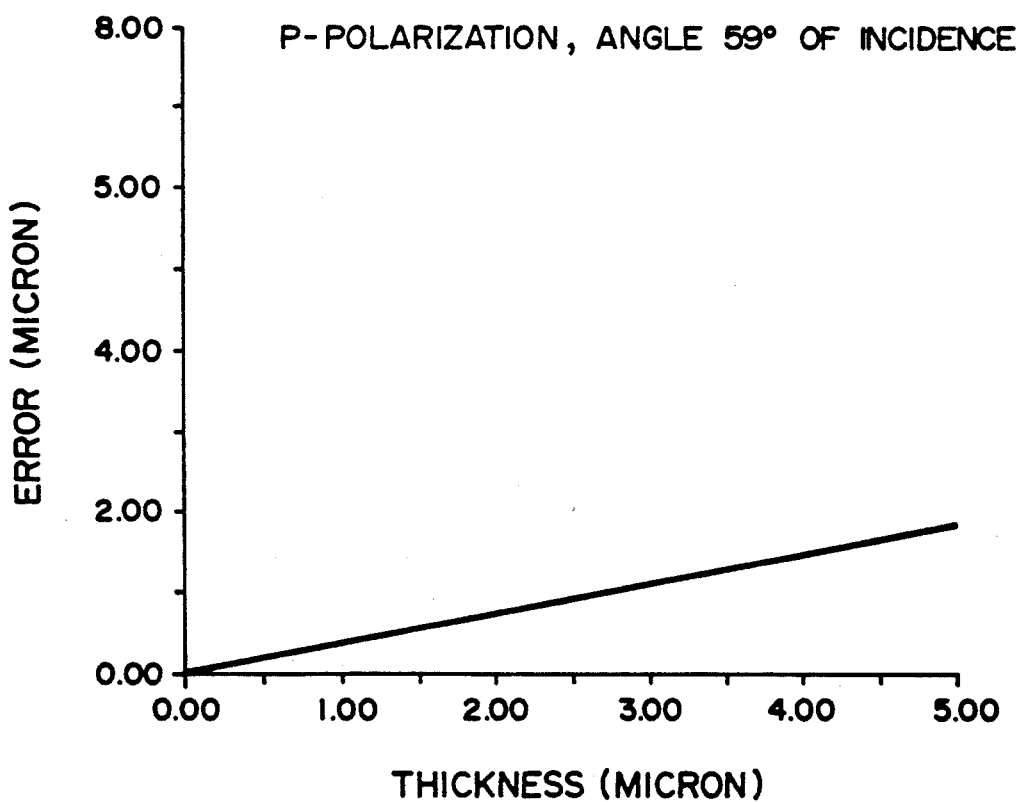
FIG. II
RELATIONSHIP BETWEEN RESIST THICKNESS AND DETECTION ERROR UPON DETECTION WITH P-POLARIZATION AT AN ANGLE NEAR TO ANGLE OF BREWSTER (58.78°)

LITHOGRAPHIC APPARATUS AND METHOD

BACKGROUND OF THE INVENTION

The present invention relates to a lithographic apparatus and a lithographic method, or more in particular to an apparatus and a method effective for forming a fine pattern on the order of submicrons.

If a fine pattern is to be formed, it is necessary to irradiate a lithographic beam on a silicon wafer with high accuracy. In order to irradiate a silicon wafer with high accuracy, the height of the water, i.e., the direction of beam irradiation must be determined correctly. The reason is described below.

When an electron beam machine is used as a lithographic apparatus, an electron beam is not irradiated in the direction perpendicular to the wafer. Unless the wafer is at a predetermined height, therefore, the beam irradiation is displaced from the designed position at the parts where the electron beam reaches with a great deflection, i.e., the peripheral parts of the drawing region. In an optical lithographic apparatus, on the other hand, the shallow depth of focus of ultraviolet ray causes an increased width of the beam irradiated on the wafer if the wafer is displaced, thereby often making it difficult to draw a fine pattern.

Methods and apparatuses for measuring the height of an object have conventionally been suggested.

The configuration described below, for example, is disclosed by JP(U)-A-52-139768, JP(U)-A-1-157423 and JP(U)-A-1-167733. Specifically, a laser beam is focused is spot and applied on an object, and the reflected beam is detected by a position sensor (a semiconductor sensor with an output signal changing depending on the beam-receiving position). The signal thus detected is amplified, subjected to an analog computation and converted into a voltage signal linearly changing with height, thereby measuring the height of the object.

The height information obtained in this way is used to correct the deflection of the electron beam and the focal point of the ultraviolet ray.

The conventional method described above poses no special problem in writing a reticle or mask pattern by an electron beam machine. In what is called the direct-writing process for drawing a pattern directly on a semiconductor wafer, however, the following problems are posed:

(1) In the direct-drawing process, a pattern is sometimes drawn over a circuit pattern already formed. When measuring the height in such a case, a signal of sufficient intensity cannot be detected resulting in a lower accuracy due to the scattering of the detected light by the base pattern.

(2) The beams reflected from the wafer surface and the resist (light-sensitive material) surface coated on the wafer interfere with each other and thus the detection signal is reduced leading to a lower accuracy.

For these reasons, a pattern drawing of high accuracy and density becomes difficult.

A height-measuring instrument so configured that the incident beam is applied at an angle of Brewster against the wafer is disclosed in JP-A-59-188931. This instrument includes a device for deflecting the reflected beam and receiving the deflected beam components.

JP-A-61-177719 is cited as a reference disclosing a configuration for detecting an alignment mark as one of the prior art related to the present invention. The art of correcting the electron beam on the basis of the difference between alignment mark height and pattern height is disclosed in JP-A-3-46220. According to this technique, the laser beam for detecting the height is irradiated only on a pattern region.

Further, JP-A-2-21553 is shown as another reference disclosing the art related to the present invention. This reference discloses the art for irradiating a laser beam for measuring the wafer position in the direction parallel to the lithographic beam.

Also, a measure to be taken against a tilted wafer is disclosed in JP-A-3-46725.

Further, JP-A-1-170022 discloses the art for measuring the heights of a plurality of points on the wafer.

SUMMARY OF THE INVENTION

A first object of the present invention is to provide a lithographic apparatus and method capable of drawing a pattern with high accuracy without being affected by the conditions of the surface of a specimen like a wafer, i.e., the interference or the like of a circuit pattern formed or the resist coated on the specimen surface.

In order to achieve this object, according to the present invention, there is provided a lithographic apparatus and method in which a light source of a first wavelength and a light source of a second wavelength are used separately from each other to measure the height of an object, and the focal length of the lithographic beam or the amount of deflection is corrected, thereby reducing the effect of interference by resist or the like.

Further, a plurality of light paths having different directions of irradiation on an object are used separately from each other to measure the height of the object, and the focal length or the deflection of the beam is corrected, thereby reducing the effect of scattering due to, in particular, the circuit pattern or the like of the object.

When the height is measured on a plurality of linear patterns arranged in the direction X, for example, the intensity of the detection beam applied from the direction Y in FIG. 1A is reduced due to the scattering at the edge of a pattern 100. The detection beam applied from the direction X as shown in FIG. 1B, on the other hand, is not scattered at the edge of a pattern 11, and therefore the intensity thereof is not reduced. As a result, in the case where two detection light paths are prepared in the directions X and Y, the reduction in accuracy due to the decrease in the intensity of the detection beam is prevented by implementing the detection along an axis in the same direction as the pattern arrangement.

Assume that the thickness of a resist 102 is d, the refractive index thereof n, the detection wavelength λ and the angle of incidence of the detection beam θ. The interference by the resist is caused and the detections beams weaken under the condition expressed by the formula shown below.

$$d = \lambda \frac{n}{2} \sin\theta \text{ or } 2d\sqrt{n - \sin^2\theta} = (2m + 1)\lambda/2$$

$$(m = 0, 1, 2, \ldots)$$

The interference can thus be avoided by changing the value λ or θ. In the case where the interference occurs at a wavelength of, say, $\lambda_1$ with light sources prepared for a plurality of wavelengths, the use of a wavelength of $\lambda_2$ half-wavelength different from $\lambda_1$ makes it possible to avoid the reduction in detection beam intensity due to interference. The interference can also be prevented by changing the angle of incidence $\theta$.

A second object of the present invention is to minimize the height detection error of an object of lithography, i.e., the wafer due to the resist layer formed thereon.

In order to achieve this object, there is provided according to the present invention a lithographic apparatus and method in which P-polarized detection beams are applied at an angle of Brewster on an object in such a manner that substantially the entire incident beams pass through the resist. In other words, the reflection on the resist surface is eliminated. The result is that the detection beams are reflected solely on the surface of the object and substantially the whole reflected beams are passed through the resist layer and detected. The light reflected on the resist layer which makes up noises is substantially reduced to zero.

A third object of the present invention is to provide a configuration for stably fixing a sensor arranged in a specimen chamber and also to facilitate the handling for adjustment.

In order to achieve this object, according to the present invention, there is provided a lithographic apparatus and method in which the holder of the sensor is supported on two ends. Also, the retainer is made retractible through the side wall of the specimen chamber to facilitate the handling at the time of adjustment.

A fourth object of the present invention is to improve the reliability of the position-measuring instrument for the wafer applied to a lithographic apparatus thereby to prevent the false operation of the measuring instrument.

In order to achieve this object, there is provided according to the present invention a lithographic apparatus and method in which the intensity of emission of the light emitter of the measuring instrument and/or the intensity of receiving of the light receiver are monitored for judging the operating conditions of the instrument.

A fifth object of the present invention is to specify accurately the height of the part of the object irradiated with a lithographic beam even when the object is displaced vertically or tilted In order to achieve this object, there is provided according to the present invention a lithographic apparatus and method in which a plurality of detection beams are irradiated on an object in the direction substantially parallel to the lithographic beam, and by utilizing the relation between the positions of irradiation of the beams reflected on the object, the detection beams and the lithographic beam, the height of the position of beam irradiation on the object is specified. When a lithographic beam is positioned at the center between two detection beams, for example, the height of the position of beam irradiation is determined by averaging the heights of two portions of a wafer obtained from the detection beams.

BRIEF DESCRIPTION OF THE DRAWINGS

FIGS. 1A and 1B are diagrams showing the effect that pattern edges on the wafer have on height detection beams.

FIG. 2 is a diagram showing the interference caused by resist.

FIG. 11 is a diagram showing the relation between thickness and detection error with the resist height detected by P-polarized beam at an angle of incidence of 59° proximate to the angle of Brewster (58.78°).

DESCRIPTION OF THE PREFERRED EMBODIMENTS

Embodiment 1

Figure 3:
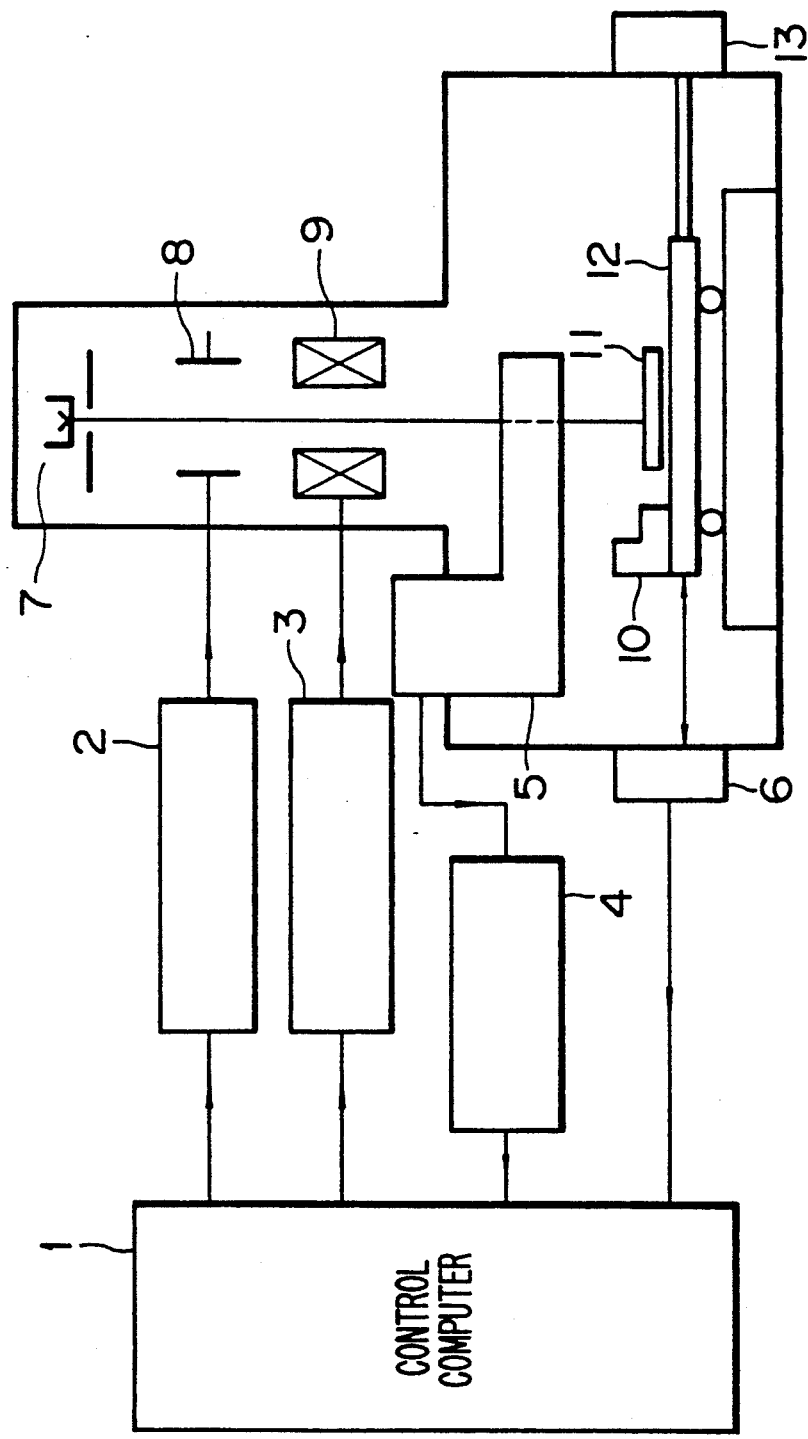
FIG. 3 is a schematic diagram showing an electron beam machine according to a first embodiment of the present invention.
Figure 4:
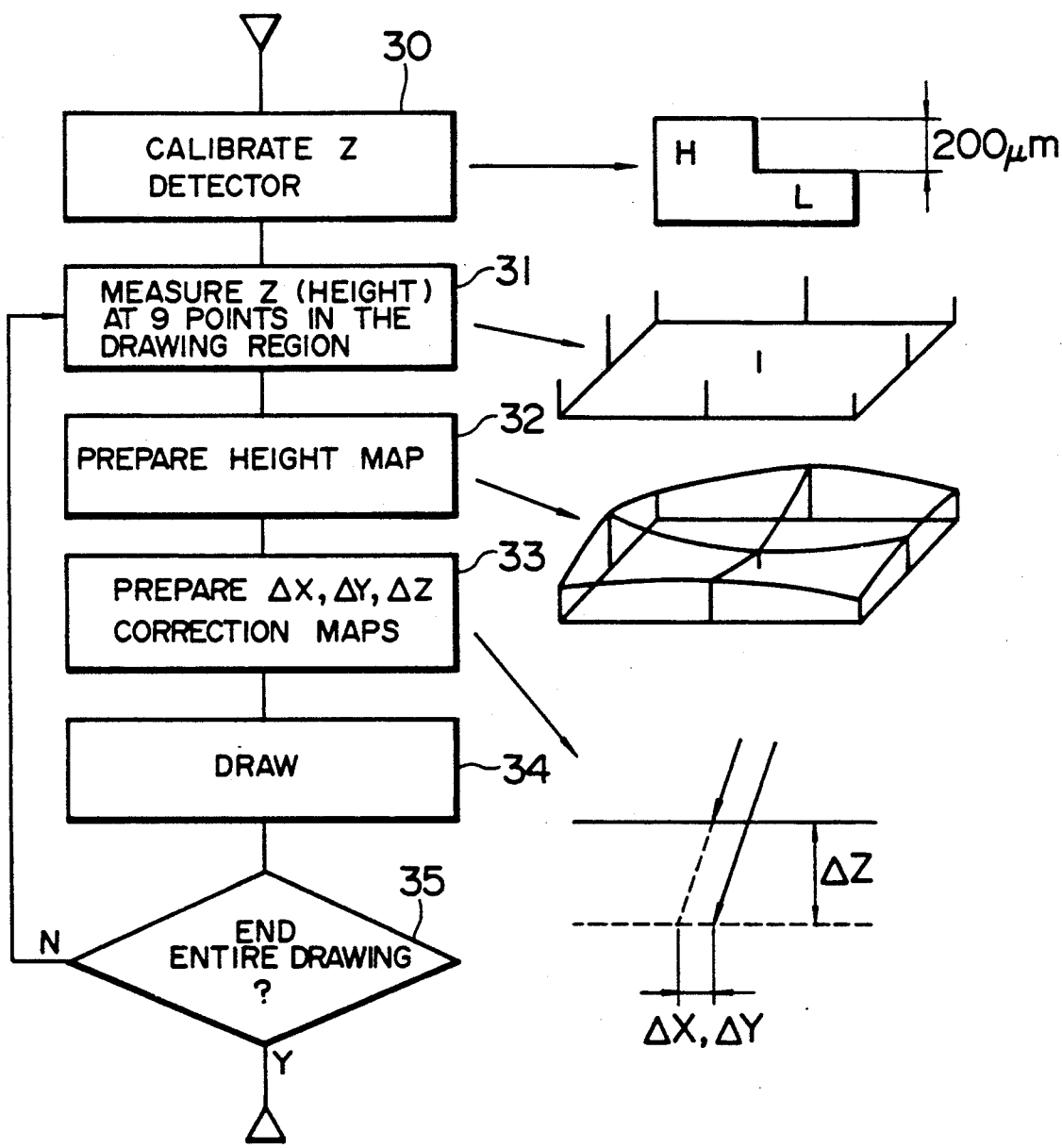
FIG. 4 is a flowchart representing the operation of the electron beam machine shown in FIG. 3.

An electron beam machine according to this embodiment is schematically shown in FIG. 3, and a flowchart of operation of the same apparatus in FIG. 4.

An electron beam emitted from an electron gun 7 shown in FIG. 3 is regulated by an optoelectronic system 9 and deflected by a deflector 8 to draw a pattern of integrated circuits on a specimen (wafer) 11 on a stage 12. Upon complete drawing of a pattern in a deflectable range of the electron beam, a drive system 13 moves the stage 12 or continues to draw a pattern while moving the stage 12.

The Z correction, i.e., the beam correction in accordance with the height change of the wafer 11 during the pattern drawing is effected by the steps of flow shown in FIG. 4. First, before drawing, a height standard 10 is measured to calibrate a Z measuring instrument (step 30). The standard 10 has planes L and H which is formed 200 μm higher than plane L. The planes L and H are measured by the height-measuring instrument 5 to calibrate the offset and gain. The measuring instrument 5 is arranged direct above the stage in the specimen chamber, and a detection light source and a position sensor outside the specimen chamber (on the atmospheric side). A detection signal is converted into a digital signal proportion to the height by a signal processor 4, read into a control computer 1, and compared with a reference value for calibrating the measuring instrument 5.

Figure 5:
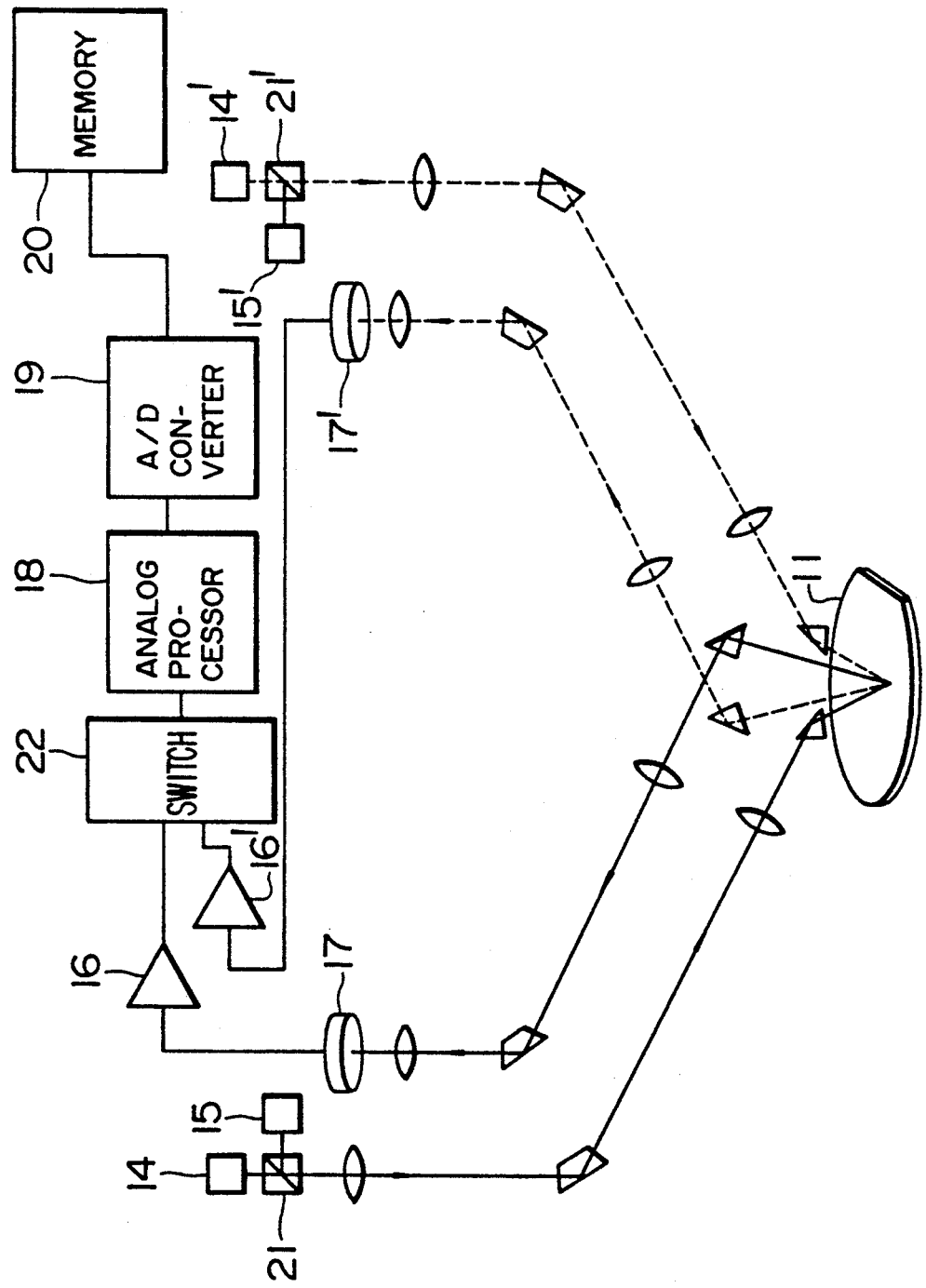
FIG. 5 shows a configuration of a measuring instrument according to the first embodiment.

Upon completion of calibration of the measuring instrument 5, the height at nine points in the drawing region is measured (step 31). On the basis of this data, a height map of the drawing region is prepared (step 32). The height ΔZ from the reference plane (plane L) and the error ΔX, ΔY along the directions X, Y due to the height ΔZ (which are caused by the deflection of an electron beam) are computed to prepare a correction data (step 33). The data inputted to the deflector 8 is corrected on the basic of this data in order to draw a pattern designed on the assumption that the wafer is positioned at a reference height. Specifically, by use of this correction data, the Z correction is effected by a dynamic focal controller 3 and a deflection controller 2 while drawing a pattern (step 34). Until the drawing is complete over the whole surface of a wafer, the Z correction is effected for each drawing region in similar fashion Now, the measuring instrument 5 will be explained in detail with reference to FIG. 5. In FIG. 5, light sources 14 and 15 are monochromatic ones having different wavelengths and usually include a laser diode. The monochromatic beam emitted from the light source 14 is irradiated on a specimen 11 through a light path shown by solid line by way of a half mirror 21. The detection beam reflected on the specimen surface is finally applied to a position sensor 17. Upon vertical movement of the specimen surface, the position of the detection beam on the position sensor 17 undergoes a change thereby to change the output current value of the position sensor. This current change is amplified as a voltage change at an amplifier 16.

A switch 22 is operated in accordance with the detection beam path.

The detection signal in voltage form is converted into a voltage signal proportional to height by an analog processor 18 and further into a digital amount by an A/D converter 19. This digital data is stored in a memory 20, and is read by a drawing control computer 1. Thus the height is determined and the Z correction data calculated.

Since an electron beam is used, the specimen 11 is placed in vacuum. The light sources 14, 15 and the position sensor 17, on the other hand, are disposed on the atmospheric side taking the maintenability into consideration. The amplifier 16 and subsequent states are also placed on the atmospheric side. In view of the fact that the light paths range from atmosphere into vacuum, a movable part should not be placed in a light path as far as possible to assure maintenability and adjusting ease. According to the present embodiment, therefore, a half mirror 21 is used to mix the monochromatic beams of the light sources 14 and 15, thereby eliminating movable members in the light path. If the same optical system is shared by monochromatic beams of different wavelengths, the image-forming positions would be displaced. This disadvantage is adjusted before entering the half mirror 21. It is necessary to cancel the interference due to the difference in wavelength between the light sources 14 and 15. Let $\lambda_A$ be the wavelength of the light source 24 and $\lambda_B$ that of the light source 15. It is desirable to attain the conditions satisfying the equation below as far as possible.

$$\lambda_B = (1 \pm \tfrac{1}{4}) \times \lambda_A \tag{2}$$

Because the sensitivity of a position sensor generally depends on wavelength, however, it is not desirable to use a light source of a wavelength associated with a small detection sensitivity even when Equation (2) is satisfied.

The adverse effect of interference due to a resist layer can thus be avoided by use of beams of different wavelengths.

In the case where a reflected signal decreases by the interference due to the base pattern, the adverse effect may be avoided by adding another set of measuring systems 14' to 17' and 21' having a light path indicated by dotted line in FIG. 5. The light paths indicated by solid and dotted lines cross at a right angle to each other in line with the X and Y axes respectively. This is because an integrated circuit is generally formed in the directions X and Y. A light source and a position sensor are inserted in each position sensor thereby to prevent the mechanical switching of the light paths. The detection signals are amplified by the amplifiers 16 separately from each other, and then switched by a switch 22. The subsequent stages including the analog processor 18 are shared by the detection signals.

Methods of driving a light source, though not described above, include a method of emitting a light beam by a DC current and a method using a pulse drive mainly for lengthening the life of a light source and improving the luminance as well known.

The signal detected in the manner mentioned above is converted into a voltage proportional to the height by an analog processor 18 and into a digital data by an A/D converter 19, and stored in a memory 20. From this data, the pattern-drawing control computer 1 calculates the Z correction amounts ΔX, ΔY and ΔZ explained with reference to FIG. 4, so that the deflection amount is corrected while drawing a pattern.

According to the present embodiment, the height of the specimen surface is measured as a total sum of two-axis detection signals of two wavelengths, and therefore the height can be measured and a pattern drawn by calculating the Z correction amounts ΔX, ΔY and ΔZ explained with reference to FIG. 4 from the present data.

According to the present embodiment, the height of a specimen surface is measured by the sum of two-axis detection signals of two wavelengths, and therefore the height can be measured and a pattern drawn at a processing speed equivalent to the rate for the prior art.

In the embodiment described above, which is configured of light paths indicated by solid and dotted lines, a light source or the like is shared, and the direction of incidence to the specimen surface 11 may be switched by use of a mirror.

Also, instead of switching the two light paths selectively by the switch 22, an adder may be used to add the detection signals for subsequent processes. In this case, the need of switching operation is eliminated, and in the case where the circuit patterns on the specimen surface cannot be identified, it is necessary to take the effect of scattered beams into consideration.

Although the two light paths are made to cross at the right angle to each other along the direction of projection on the X-Y plane of the specimen in the embodiments described above, the angles of incidence to the specimen surface may be differentiated to reduce the effect of interference due to the resist or the like.

Further, instead of synthesizing light beams from the two light sources 14, 15 as in the above-mentioned embodiments the beam from the light source 14 may be irradiated on the specimen surface so that if the intensity of the reflected beam is less than a predetermined value, the operation may be switched to the other light source 15. In this case, the interference with the mutual light sources can be prevented Embodiment 2

According to this embodiment, the error of height measurement of a wafer attributable to a resist layer is minimized.

First, the background of this embodiment will be described. The matters mentioned below are based on the knowledge obtained by the inventors while developing the present invention.

Figure 6:
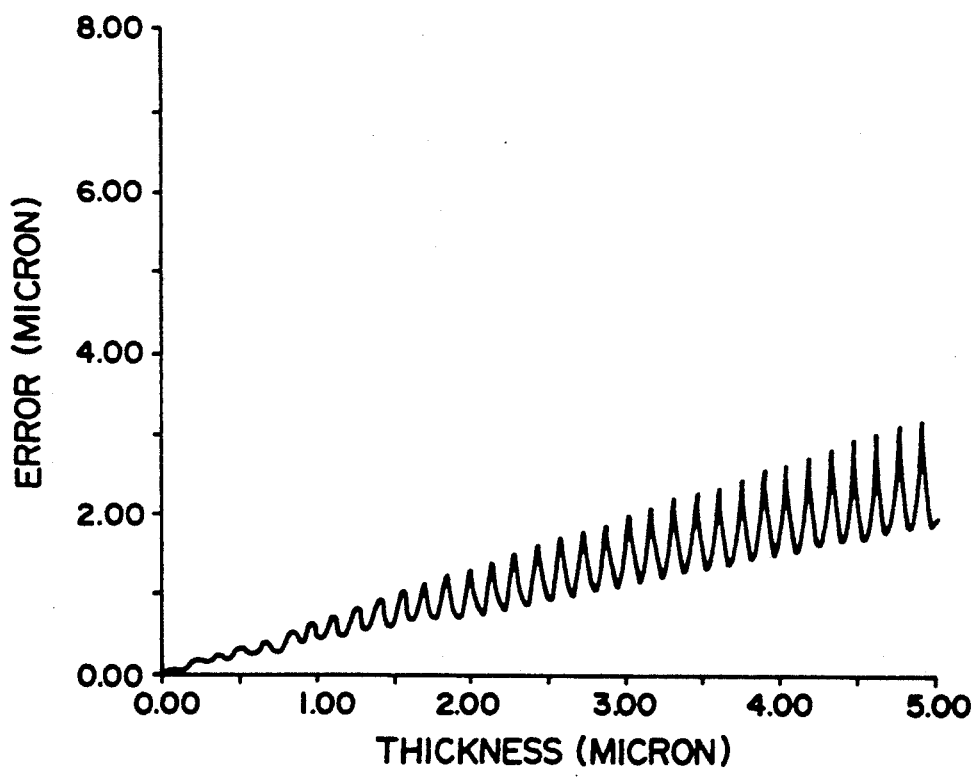
FIG. 6 is a diagram showing the relation between resist thickness and detection error with the resist height detected at an angle of incidence of 45° by P-polarized beam.
Figure 7:
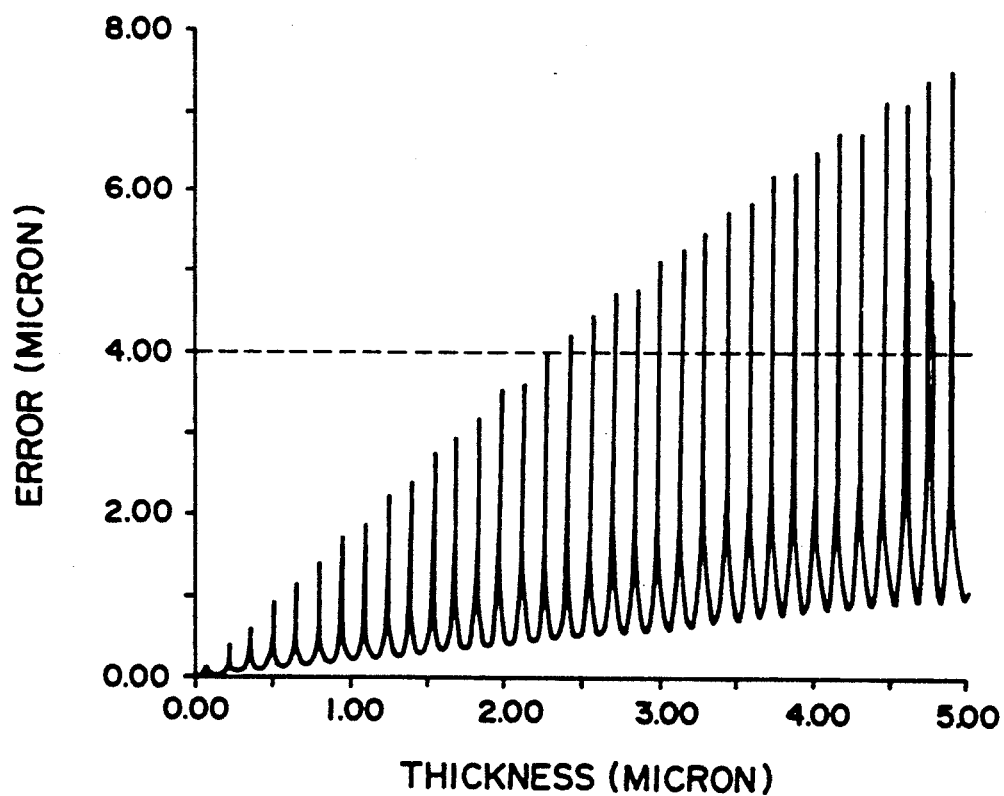
FIG. 7 is a diagram showing the relation between resist thickness and detection error with the resist height detected at an angle of incidence of 45° by S-polarized beam.
Figure 8:
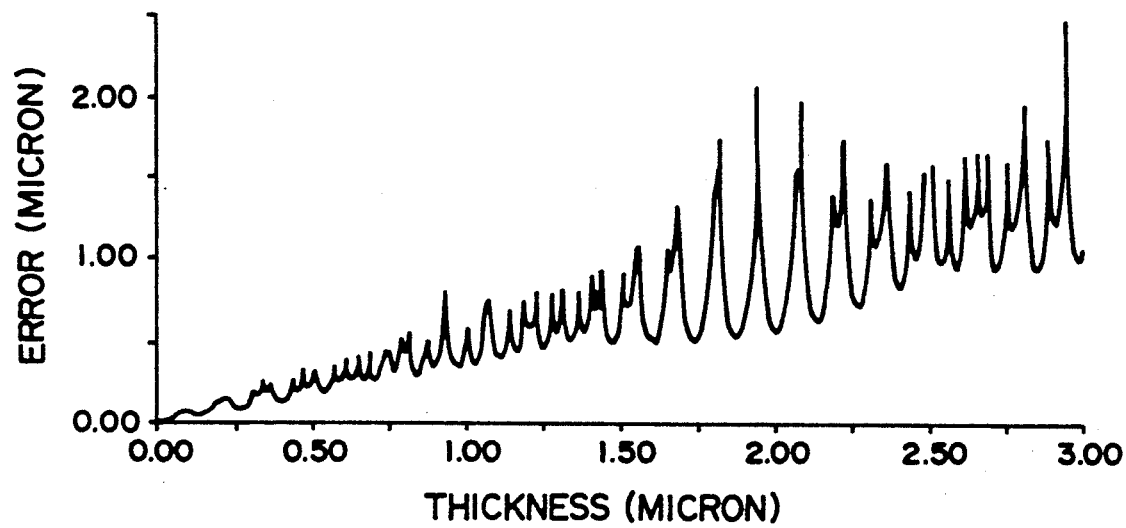
FIG. 8 is a diagram showing the relation between resist thickness and detection error with the resist height detected at an angle of incidence of 45° by (P+S)-polarized beam.

Assume that light such as semiconductor laser is converted and applied to the wafer surface, i.e., the resist layer surface at an angle of incidence of, say, 45°, and an image of the reflected beam is formed on a position sensor as an image of an irradiation spot on the wafer. The values of height detection determined from the detection values of position develop a great error. The cause of this error is shown in FIGS. 6 to 8. FIGS. 6 and 7 represent a case where S- and P-polarized beams 0.633 μm in wavelength are respectively irradiated at an angle of incidence of 45° on a wafer (with a height fixed) made of a base material of silicon and having a resist thickness of 0.0 to 5.0 μm. In each drawing, the resist thickness is plotted along the abscissa. Along the ordinate, the origin (0.00 μm) represents a height of surface of resist. In the presence of a resist, the image-forming position on the position sensor is displaced in accordance with the refractive index thereof. This displacement is proportional to the thickness of the resist layer as will be understood from FIG. 10A. It will also be seen from this drawing that a virtual point of refraction, i.e., a virtual point of reflection is situated proximate to the surface of the resist layer. The detection value of the position sensor, therefore, is higher than the resist surface. The difference E in the drawing is expressed as ERROR in FIGS. 6 and 7.

FIG. 8 shows a case in which beams having wavelengths of 0.54, 0.58 and 0.62 μm are synthesized as a detection beam.

Referring to FIG. 7, assume that the ERROR value detected is 4.00 μm. It follows that the thickness of the resist layer is substantially in the range of 2.30 to 5.00 μm. The thickness of the resist layer cannot therefore be specified accurately. This results in the wafer surface height being unable to be determined accurately.

Figure 9:
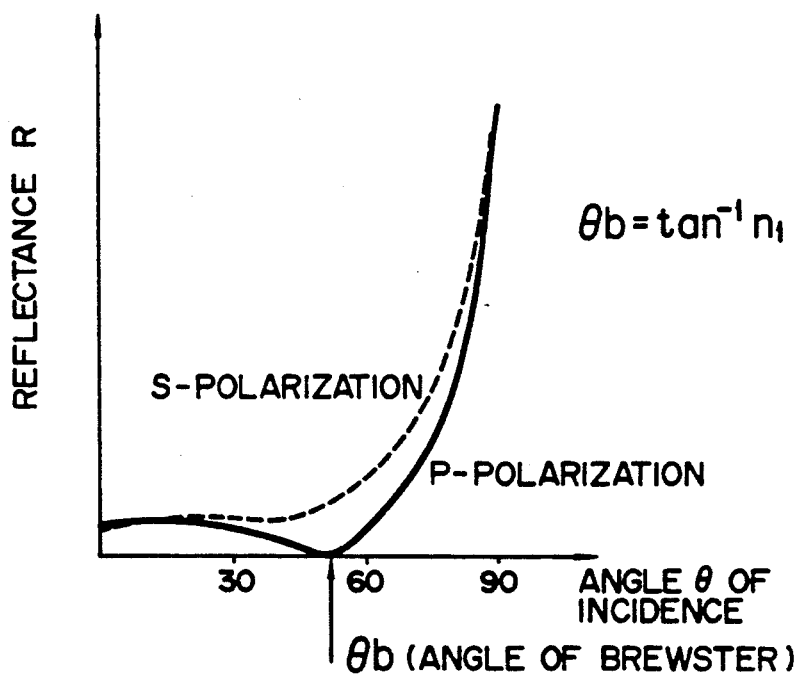
FIG. 9 is a diagram showing the relation between angle of incidence and reflectance on the object.
Figure 10A:
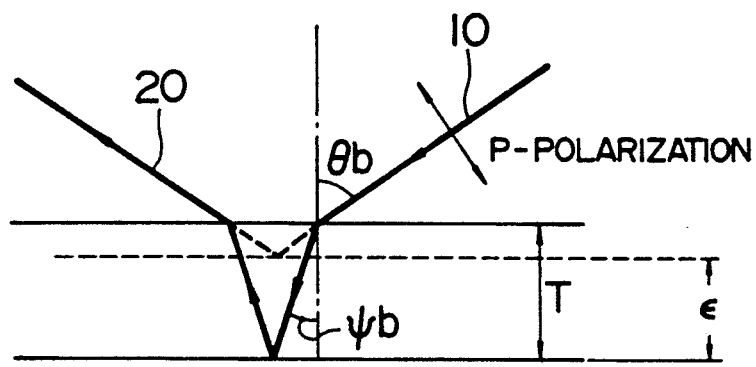
FIGS. 10A and 10B are diagrams showing the manner in which beams are reflected on the resist layer.
Figure 10B:
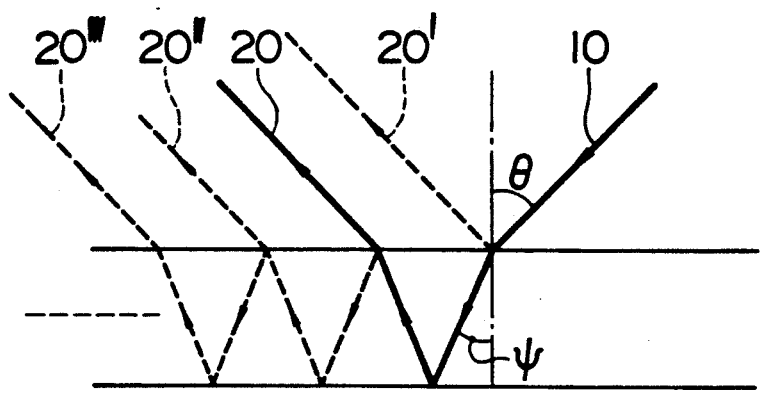

In the case where a light beam is irradiated on a transparent object like a resist, the angle of incidence of the beam and the reflectance against the angle of incidence are as shown in FIG. 9 depending on the polarization. Specifically, when the angle of incidence of p-polarized beam becomes Brewster angle the reflectance on the resist surface is 0%, so that the light beam is transmitted 100% through the surface and enters the resist layer. As a result, as shown in FIG. 10A, the light beam reflected on the surface of a wafer under the resist is also applied upward to the resist surface, but is not reflected on the resist surface and transmitted in full upward through the resist This indicates that the wafer surface under the resist is always detected regardless of the resist thickness. Comparison of this fact with FIG. 10B associated with the other conditions clarifies the effect of the embodiment More specifically, unless the conditions described above are satisfied, the incident beam 10 is reflected on the resist surface and is transmitted not only toward but also through the sensor, so that the beam reflected on the wafer is transmitted toward the resistor surface upward and then toward the sensor as a detection beam 20, reflected on the resist surface and returns to the wafer This process is repeated, whereby the detection beams 20, 20', 20' are interfered in multiple fashion, with the result that even a slight change in the resist thickness changes the interference intensity greatly. The detection value therefore undergoes a variation as shown in FIGS. 6 and 7. FIG. 10A represents a trace of light ray followed upon detection according to the present embodiment without any multiple reflections in the resist. For this reason, as shown in the graph of FIG. 11, the resist thickness and the difference between the resist surface height and the detection height is in linear relation, and no error variation is observed unlike in FIGS. 6 to 8. As a result, to the extent that the resist thickness is known, the position of resist surface can be detected accurately.

Figure 12:
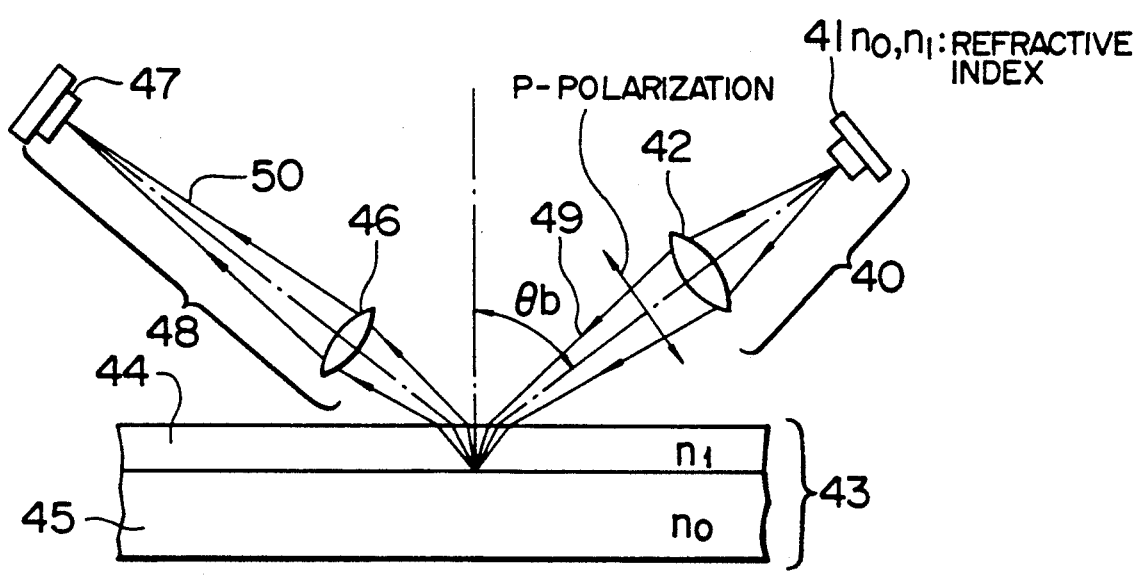
FIG. 12 is a schematic diagram showing a configuration of a measuring instrument according to a second embodiment.

FIG. 12 shows a general configuration of a height-measuring instrument according to the present embodiment. The light beam emitted from a light source 41 including a light-emitting diode or a semiconductor laser is irradiated in substantially converged form on a resist 44 coated on a pattern layer 45 of a wafer 43 making up an object of detection by a lens 42. In the process, the angle of incidence of the light beam 49 irradiated by the irradiation section 40 is set to the angle of Brewster $\theta b$, so that the light is P-polarized (linearly polarized in the direction perpendicular to the plane containing the normal on the resist surfacer and the main light ray of the incident light). According to the present embodiment, the refractive index $n_1$ of the resist is 1.65, and therefore the angle of Brewster $\theta b$ is 58.8°. In the case of a semiconductor exposure apparatus, the object of detection has a surface thereof coated with resist and therefore the refractive index thereof is substantially equal to the above-mentioned value. For a different refractive index of the surface of the object, the same effect is obtained by changing the angle of incidence to a corresponding angle of Brewster $\theta b$. The need of this change, however, depends on the accuracy required, and in most cases the angel of Brewster $\theta b$ mentioned above serves the purpose sufficiently.

The light beam irradiated on the resist surface, as explained with reference to FIG. 9, is transmitted in full due to the incidence at an angle of Brewster $\theta b$ and none of it is reflected on the resist surface. As a consequence, only the light reflected on the surface of the wafer 45 enters the sensor 48. The sensor 48 includes an image-forming lens 46 and a position sensor 47, whereby the light spot on the resist (more strictly, the light spot on the wafer pattern) is formed as an image on the position sensor 47 and the position of image formation is detected as an electrical signal. Specifically, if the wafer changes upward, the image position changes downward. Thus the height is determined as an electrical signal. The relation shown in FIG. 11 is obtained from this measuring instrument.

Figure 13:
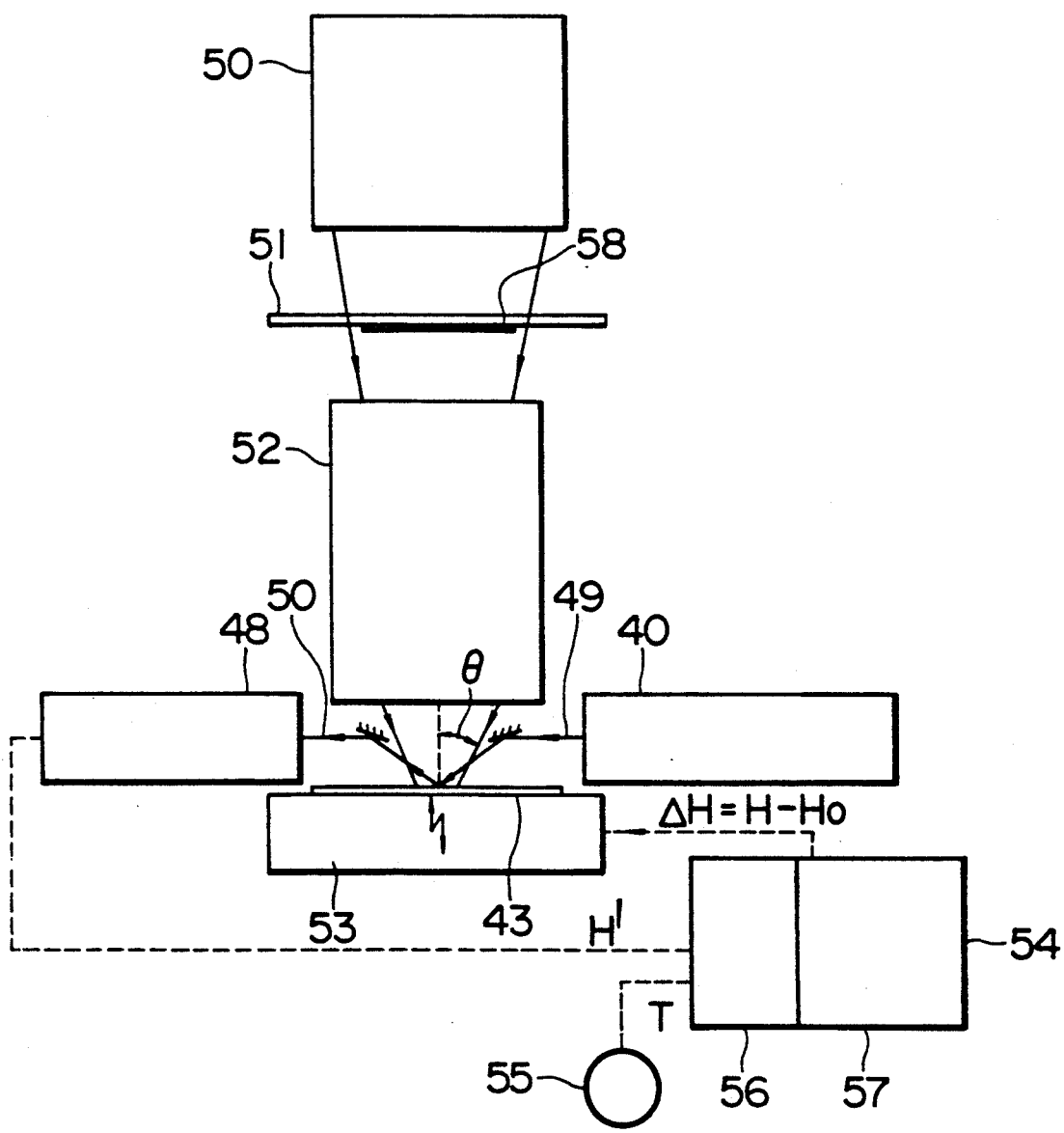
FIG. 13 is a diagram showing a configuration of an exposure system having the measuring instrument shown in FIG. 12.

An example of applying this measuring instrument to an optical lithographic apparatus is shown in FIG. 13.

The ultraviolet ray (the i ray or an excimer laser) emitted from an exposure illumination system 50 is illuminated on a reticle 51, and the light transmitted through the reticle 51 enters a reduction lens 52. A circuit pattern 58 drawn on the reticle 51 is formed as an image on a wafer 43 by the reduction lens. When the minimum line width of the circuit pattern is 0.5 $\mu$m or less (as converted on the wafer), the depth of focus decreases to $\pm 1.0$ $\mu$m or less. As a result, taking into consideration the fact that the resist thickness coated on the wafer surface is about 1 $\mu$m, it is necessary to accurately determine the upper or lower surface of the resist, i.e., the surface of the wafer. Since a reduction exposure apparatus is so constructed that the wafer 43 is driven by a wafer stage 53 for step-and-repeat exposure, however, the resulting change in wafer height after stage movement makes it necessary to detect the front or back surface of the resist accurately each time of stage movement For this purpose, according to the present embodiment, a P-polarized light beam is irradiated at an angle of Brewster substantially toward the center of the exposure region by irradiation means 40 from between the reduction lens and the wafer by a method explained with reference to the embodiment shown in FIG. 12, and the reflected light beam is detected by position detector means 48 thereby to detect the position substantially on the back of the resist.

The back side of the resist, i.e., a position between the wafer and resist surfaces is detected by the method shown in FIG. 13. Then the height H of the resist surface is determined from the height detection value H' and the input resist thickness T which is already known according to the equation below.

$$H = \frac{T\cos\theta}{\sqrt{n^2 - \sin^2\theta}} + H'$$

For an ordinary resist, n=1.65, and therefore the angle of Brewster $\theta$ is given as 58.88° from $\tan^{-1}n$, thus leading to H=0.367T+H'. The difference $\Delta$H between the resist surface height H thus determined and a predetermined target height $H_0$ is determined by a control circuit 57, and a wafer stage 53 is controlled to realize a highly accurate exposure.

By the way, if the angle of incidence of the P-polarized light is within the range of $\pm 2°$ of the angle of Brewster, the resist surface position is capable of being detected although the light is slightly reflected from the resist surface.

The height-measuring instrument according to the present embodiment is of course applicable to the electron beam apparatus shown in FIG. 3. In similar fashion, the measuring instrument according to the first embodiment finds application in the ultraviolet exposure apparatus shown in FIG. 13.

Embodiment 3

Figure 14:
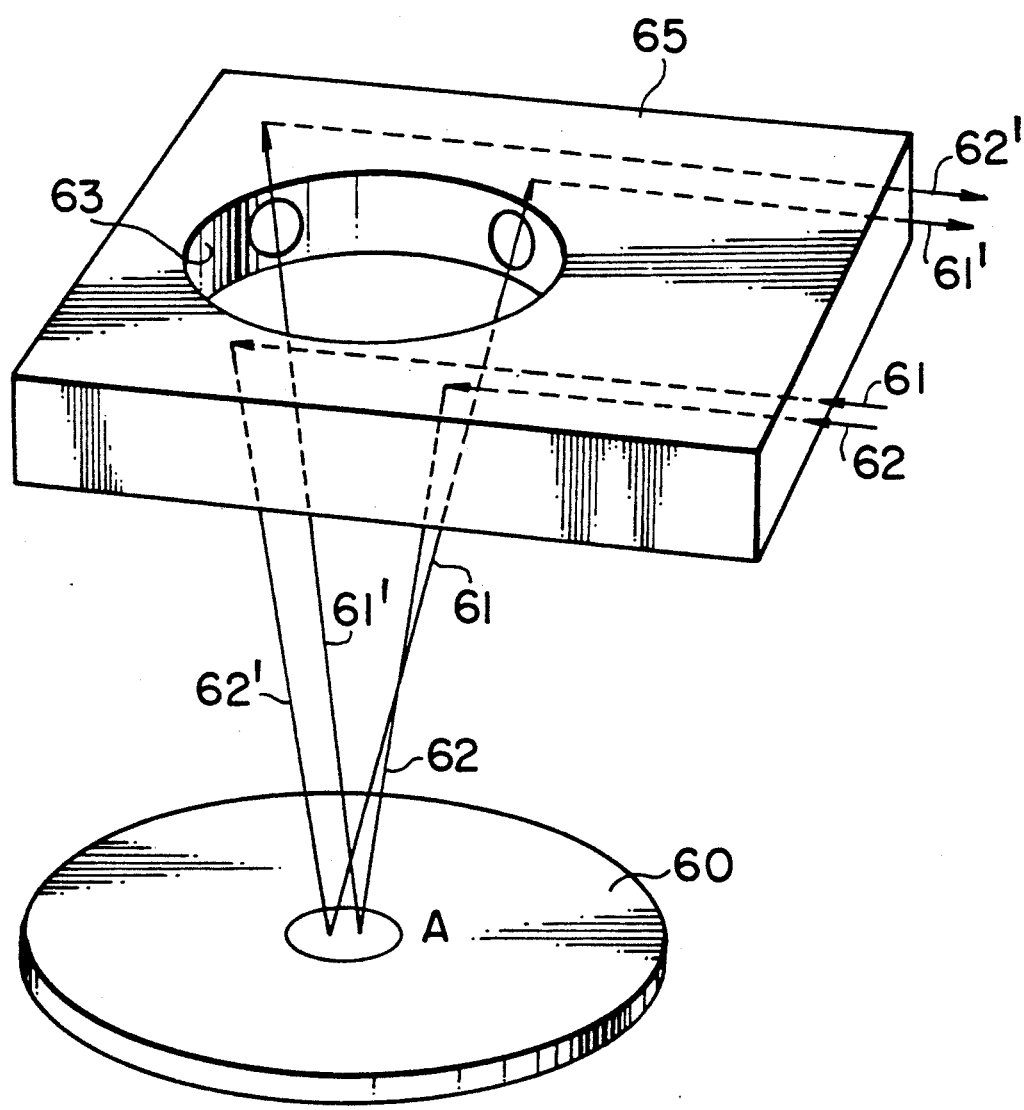
FIG. 14 is a perspective view partially showing a configuration of the measuring instrument according to a third embodiment.
Figure 15:
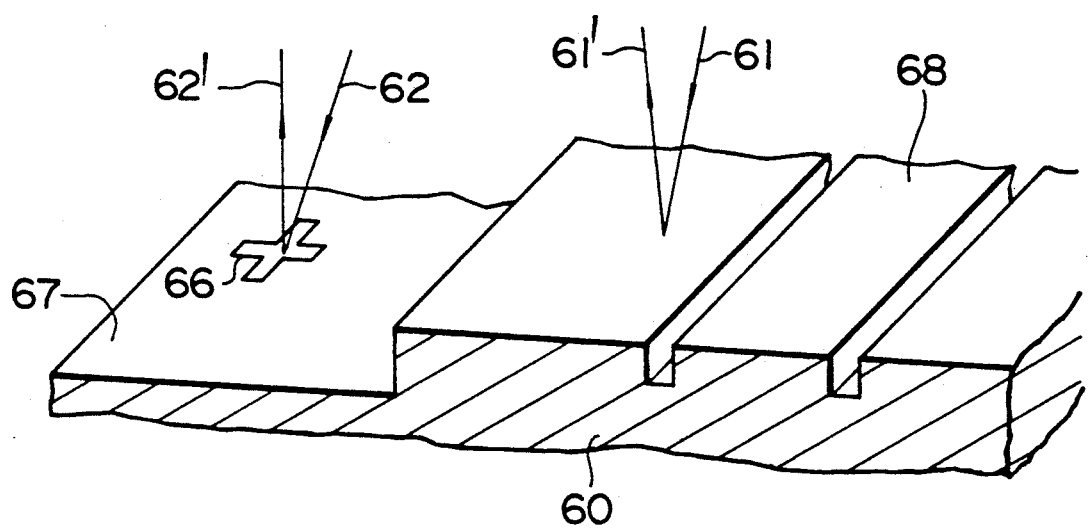
FIG. 15 is an enlarged sectional view of part A in FIG. 14.

This embodiment is such that two detection beams 61, 62 are applied to different points on the wafer as shown in FIG. 14. FIG. 15 is an enlarged sectional view of the portion where the detection beams 61, 62 are irradiated on the wafer 60.

FIG. 14 shows the forward end of the height-measuring instrument 65 used according to the present embodiment. Reference numeral 63 in the diagram designates a through hole for passing the electron beam The detection beam 62 is irradiated on a region 67 having an alignment mark 66 as shown in FIG. 15. In an ordinary electron apparatus, an electron beam is irradiated on the alignment mark 66 in order to align a pattern-drawing region, i.e., the region 68 having a pattern. The electron beam is controlled on the basis of the information contained in the backscattered or secondary electrons generated in the particular process. In recently-developed wafers, however, a plurality of patterns are formed in layers so that the pattern-containing region 68 is sometimes taller by as much as 2 to 3 $\mu$m than the region 67 having the alignment mark 66.

In view of this, according to the present embodiment, a laser beam 62 is irradiated on the region 67 having the alignment mark 66, and the light 62' reflected therefrom is introduced to a light-receiving system used in the first or second embodiment thereby to determine the height of the region 67. In similar fashion, a laser beam 61 is irradiated on the pattern-containing region 68 and the light 61' reflected therefrom is utilized to determine the height of the region 68. The difference between the two heights is determined by computer, and in accordance with the difference, the amount of deflection of the electron beam or the focal length thereof in the electron beam apparatus is controlled. A specific method of control is such that a control parameter is determined in advance in accordance with the difference between the two heights and the data sent to the electron beam machine for patterning is corrected by the parameter.

Embodiment 4

Figure 16:
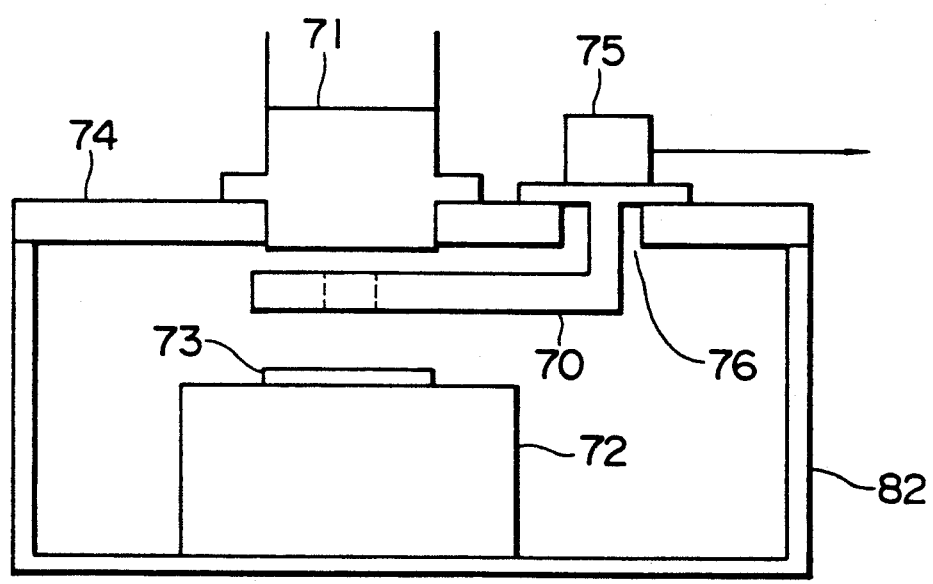
FIG. 16 is a diagram showing a detailed configuration of a specimen chamber of the apparatus shown in FIG. 3.

FIG. 16 is a sectional view showing a detailed configuration of the specimen chamber of the apparatus in FIG. 3.

A sensor holder 70 having a height detector and a semiconductor sensor for detecting backscattered electrons built therein is interposed between an objective lens 71 and the wafer 73 on a stage 72. The holder 70 has an end thereof fixed on an upper cover 74 of the chamber. Signals produced from the semiconductor sensor and the height detector are applied through an amplifier circuit 75 to a control unit (not shown).

In this arrangement, it has been made clear by the present inventors that the manner in which the sensor and detector are mounted is subject to the restrictions mentioned below. More specifically, since the gap between the lower end of the objective lens 71 and the wafer 73 is as narrow as about 30 mm, the holder 70 is required to be constructed in small size. Also, the need to detect the height with the precision of 1 μm or less makes it necessary to fix the sensor holder 70 stably with such a precision that the vibration at the lower end thereof is not more than 1 μm. Further, in order to maintain the lens characteristics, the lower surface of the objective lens 71 cannot be machined for fixing the holder 70.

To facilitate maintenance, on the other hand, the whole holder could be demounted from an access hole 76, with the result that the maintenance work was possible without opening the upper cover of the chamber 77.

In order to meet an increased throughput of the pattern-drawing means and the tendency of an increased wafer diameter and a finer pattern, however, the necessity has arisen for changing the structure in two points. Firstly, an increased throughput requires an enlarged deflection region, and for this purpose, the diameter of the objective lens 71 must be increased. Secondly, in order to meet the tendency of an increased wafer diameter, the coverage of the stage is required to be increased, thus necessitating a larger chamber According to the method shown in FIG. 16, however, the distance from the fixing point of the sensor holder 70 to the forward end of the holder containing the sensor is so large that the shown construction supporting the holder only on one side makes it difficult to set the sensor with a sufficient stability to make measurement with the precision of 1 μm or less.

Further, the holder has become so long that it is difficult to make an arrangement to demount the holder from the upper cover. Another problem is the difficulty of securing a sufficient signal-to-noise ratio for handling specimens with fine patterns if the detection signal amplifier circuit 75 is arranged outside of the specimen chamber because the distance between the sensor and the amplifier are too long.

These problems can be solved by a construction in which the sensor holder is fixed not on the upper cover but on the side wall of the chamber to permit the demounting thereof from the particular side wall. The forward end of the holder may be fixed with high precision by preparing a fixing jig in the vicinity of the beam axis or on the surface opposite to the side wall. Also, the signal-to-noise ratio is improved by arranging the amplifier circuit just beside the sensor in vacuum.

A construction permitting the demounting from the side wall of the specimen chamber facilitates the removal of even a long holder Also, the holder being fixed on the two instead of one side makes it possible to realize a very stably fixed condition. Further, since the signal is amplified just beside a detector, a signal detection small in noises is made possible.

Figure 17:
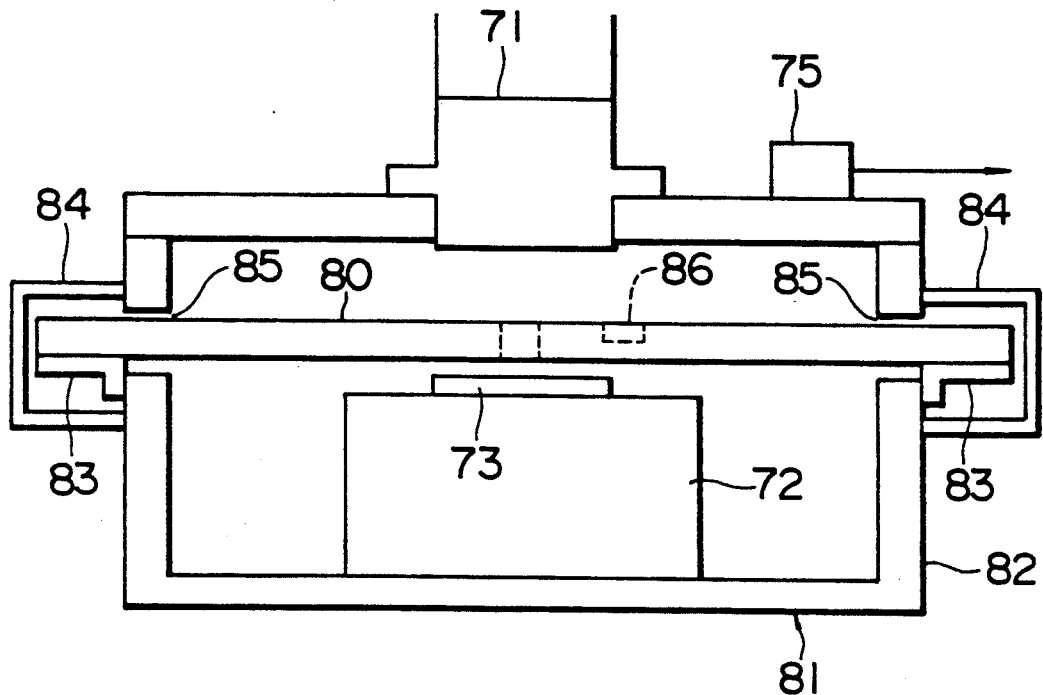
FIG. 17 is a diagram showing a configuration of a specimen chamber of the apparatus according to a fourth embodiment.

FIG. 17 shows an example of a method of mounting a sensor in an electron beam drawing apparatus according to the present embodiment.

The component parts in FIG. 17 identical to those of the same reference numerals as in FIG. 16 are designated by the same reference numerals and are not described entirely It will be easily assumed by those skilled in the art that the concept of the present embodiment is applicable to the optical lithographic apparatus using the ultraviolet ray or the like.

Figure 18:
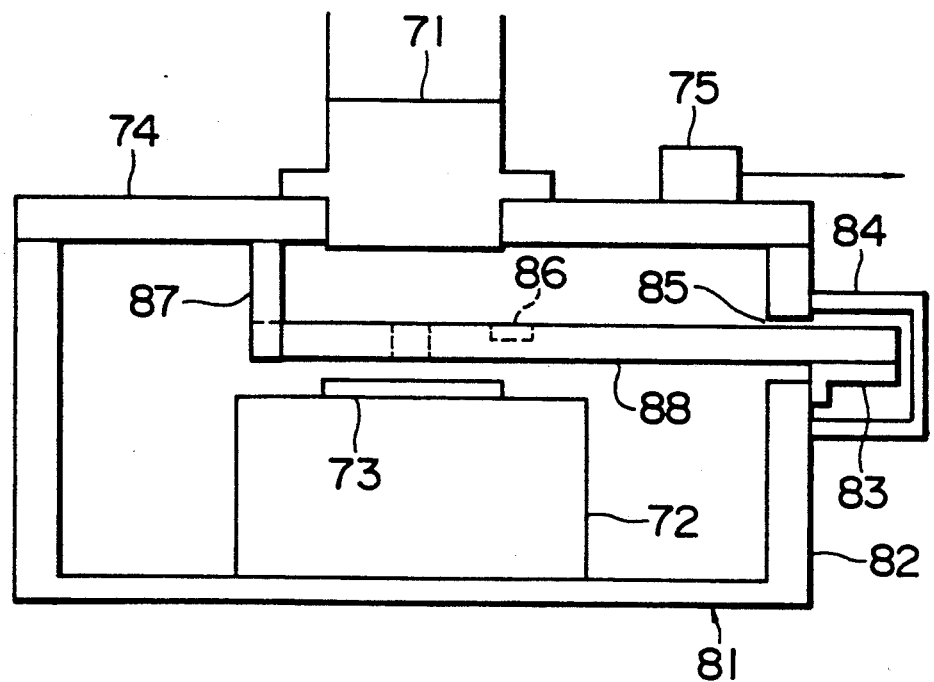
FIG. 18 shows a modification of the apparatus of FIG. 17.

The sensor holder 80 having a reflected electron detector and a height detector built therein is fixed by a fixing jig 80 mounted at the ends of the side wall 82 of the specimen chamber 81 and having a height detector or the like built therein. At the time of maintenance of the sensor, the cover 84 for keeping the sensor in vacuum is removed so that the holder 80 is driven along a guide rail and adapted to be taken out through a window 85 formed in the side wall of the specimen chamber. By fixing the ends of the holder in this way, the sensor and detector can be installed in stable manner while at the same time keeping the maintenability thereof Further, the amplifier 86 in the first stage is arranged in the holder near the sensor, thereby producing a signal of high S/N. The amplifier 75 is arranged in the second stage FIG. 18 shows a modification of the embodiment shown in FIG. 17. In this apparatus, a height detector and a backscattered electron detector are built in a holder 88 fixed on an upper cover 74 of the chamber. And the holder 88 is fixed by a vertical holder 87 and a fixing jig 83 mounted on the side wall of the specimen chamber. This construction reduces the length of the holder 88 and makes it possible to take out and adjust the backscattered electron detector.

Figure 19:
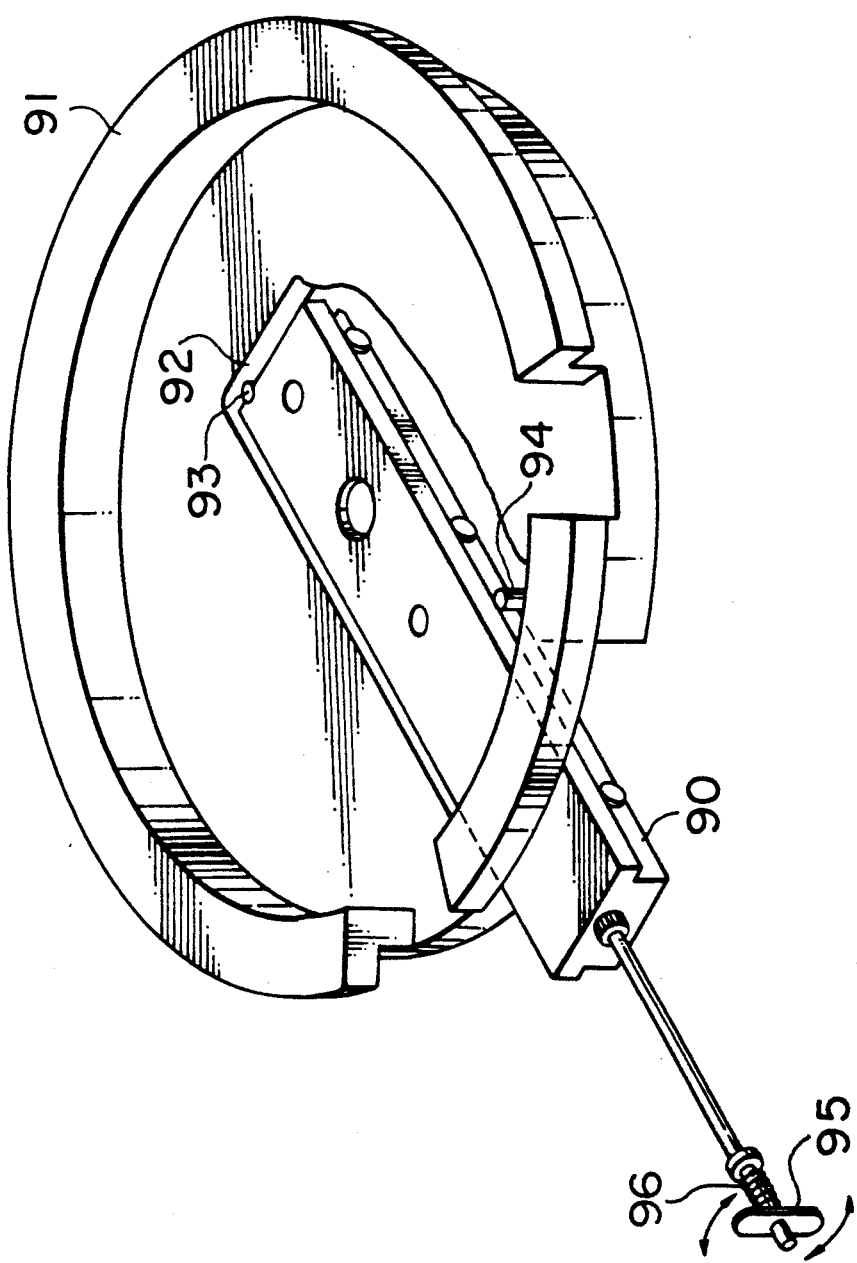
FIG. 19 is a perspective view showing another manner in which a holder is mounted.

FIG. 19 shows another manner in which the holder 90 is mounted against the chamber 89.

An upper cover (not shown) of the specimen chamber has a support 91 and a rest 92 shown in FIG. 19. A holder 90 inserted from the side wall of the chamber is moved along a rail (not shown) attached to the support 91. The rest 92 mounted on the upper cover of the specimen chamber has a positioning pin 93, which, together with a positioning pin 94, determines the fixing position of the holder 90. For fixing the holder 90, it is inserted into the rest 92, after which a lock pin 95 is turned into engagement with a fixing means (not shown) mounted on the upper cover. As a result, the holder 90 is set in position as it is kept pressed toward the rest 92 by a spring 96.

Figure 20:
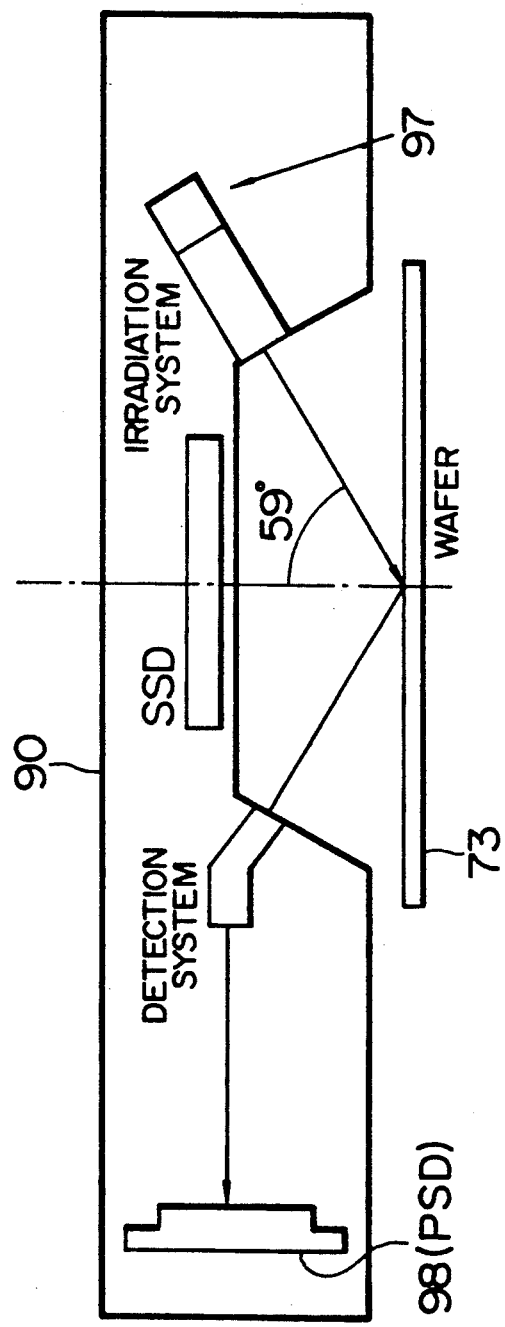
FIG. 20 is a partially enlarged sectional view of the holder shown in FIG. 19.

An internal structure of the holder 90 is shown as a sectional view in FIG. 20. The light from a laser diode 97 arranged in an irradiation system is focused on the surface of a wafer 73 by a lens inserted in the system. The light reflected from the wafer 73 is changed in direction by a lens and a prism disposed in a detection system, and is focused on a position sensor 98 arranged near to the rear end of the holder 90.

Embodiment 5

This embodiment is intended to improve the reliability of a wafer position-measuring instrument.

Figure 21:
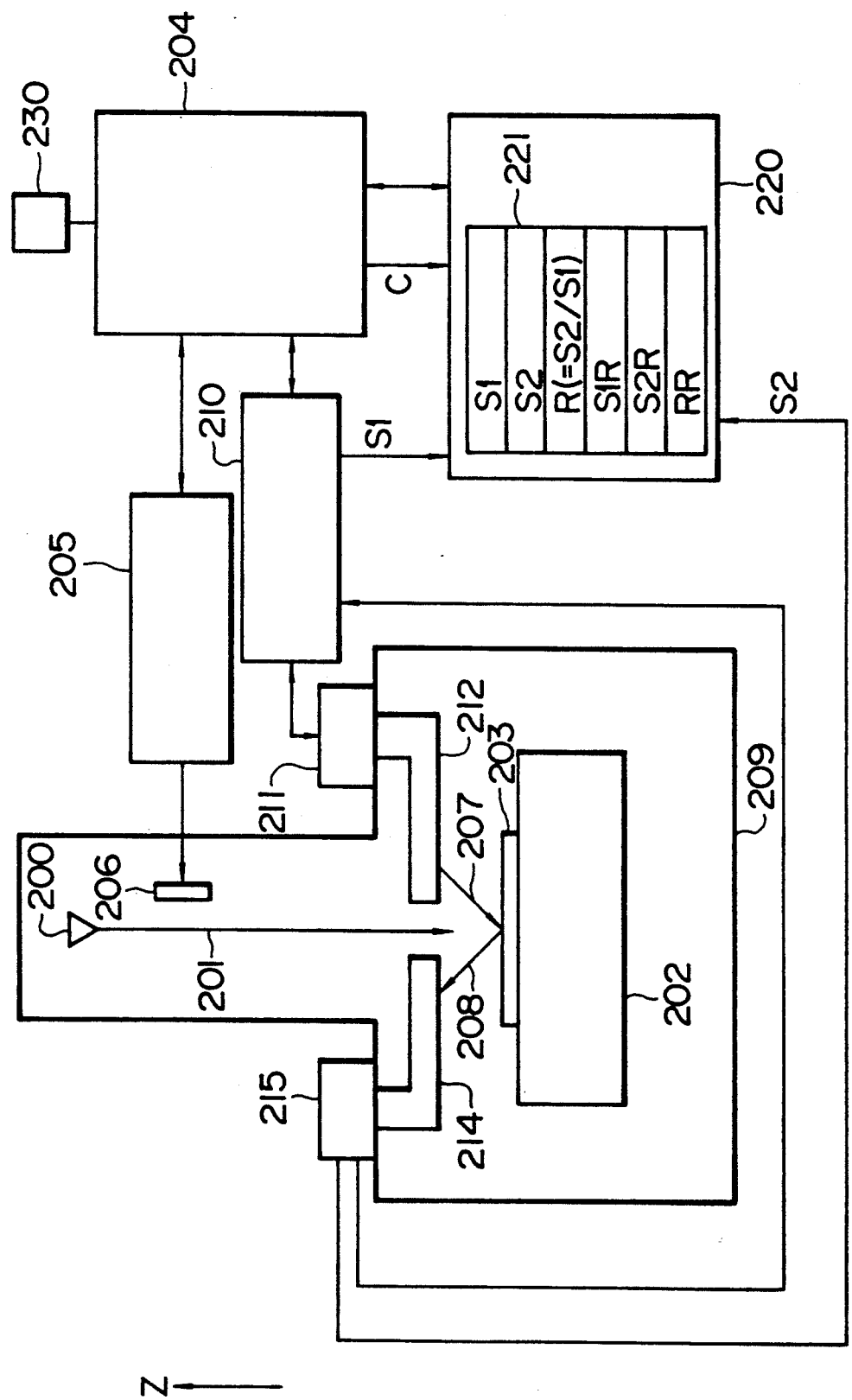
FIG. 21 is a diagram showing a configuration of an electron beam machine according to a fifth embodiment.

Explanation will be made below about the present embodiment taking an electron beam apparatus as an example (See FIG. 21).

An electron beam 201 emitted from an electron gun 200 is converged by electron lenses (not shown) disposed in a column, and is irradiated on a wafer 203 mounted on a stage 202. A control computer 204 applies a pattern data for drawing the desired pattern on the wafer to a control circuit 205, which in turn is operated draws the desired pattern on the wafer by deflection through an electron beam deflector 206. During the drawing, a pattern cannot be drawn with high accuracy if the wafer height (in the direction z in the diagram) is changed since the position of beam irradiation is changed on the wafer for the same deflection signal. For this reason, a height detector is arranged to measure the change in the direction z of the wafer An example of the principle of height measurement will be explained with reference to the same diagram. The light from an irradiation section 211 including a laser diode and an optical lens is irradiated on a wafer through a light path section 212 configured of a plurality of reflectors, and the light 208 reflected on the wafer is introduced to a detector 215 through a light path 214. The detector 215 includes a position detector diode for detecting the position of the reflected light. The position along the direction z of the wafer corresponds to the position of the reflected light on the position detector. By processing the position of the reflected light through a processor circuit 210, therefore, the wafer height can be determined. The control computer 204 is for controlling deflection circuits 205, 206 on the basis of the height information thus obtained, thereby adjusting the deflection of the electron beam into an appropriate quantity commensurate with the wafer height.

This apparatus comprises a circuit 220 for monitoring the height detector.

The function of this circuit will be explained. The monitor circuit 220 has two inputs. One is the illumination intensity S1 of the laser diode The intensity S1 may be obtained from a monitor signal of the laser diode. The other input is the detection intensity signal S2 of the position detection sensor. This represents a detected intensity of the reflected light. The monitor circuit 220 determines the signals S1, S2 and the ratio R ($=S2/S2$) Therebetween, and records them in a recording circuit 221. Further, this circuit has the function of recording the change from a point immediately after the adjustment of S1, S2 and R. with regard to the illumination intensity signal S1, for instance, assume that the intensity immediately after adjustment is S10 and the intensity after the lapse of a predetermined length of time S11. Then, a parameter S1R indicating a secular variation is given as $$S1R = S11/S10$$

In similar fashion, the secular variation of the intensity of the detection beam is expressed as $$S2R = S21/S20$$

The secular variation of the intensity ratio R, on the other hand, is given as $$RR = R1/R0$$

where R0 is the ratio immediately after adjustment and R1 the intensity ratio after the lapse of a predetermined length of time.

The monitor circuit 220 monitors the values representing these secular variations at regular intervals of time. This circuit is supplied with an allowance C in advance from the control computer. The allowance C is a parameter for deciding whether the values S1R, S2R and RR are abnormal or not. Specifically, the allowance C decides an abnormality when the value S1R, S2R or RR decreases below its own value. The apparatus according to the present invention, which has a display section 230, is capable of displaying the change in any of the values. A preliminary study confirmed that the height measuring instrument under consideration is effectively usable for R of up to 0.4, so that 0.7 is set as value C.

Figure 22:
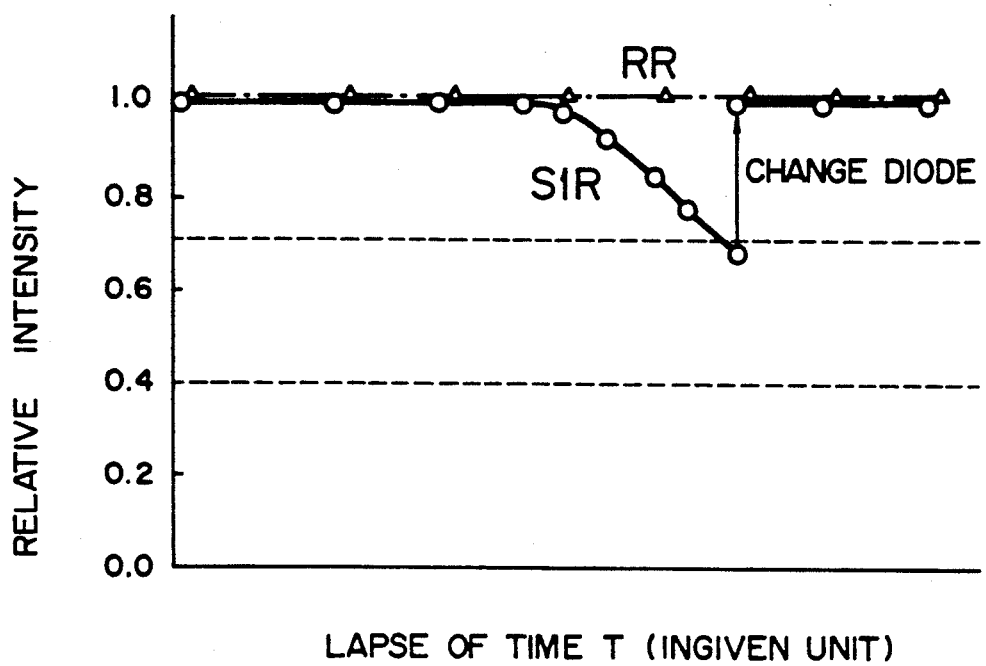
FIG. 22 is a graph showing an example of the output result of a circuit for monitoring the height measuring instrument according to the fifth embodiment.

In the above-mentioned configuration, the use of an electron beam pattern drawing apparatus generates a condition as shown in FIG. 22. Specifically, the inventors found that the relative illumination intensity S1R is deteriorated while the relative change RR in the ratio between illumination intensity S1 and detection beam intensity S2 remains unchanged with time. Deciding that this is caused by the deterioration of the laser diode, the inventors changed the laser diode in the detector 211 by taking advantage of a short length of time intervals between drawing periods. As a result, the illumination intensity S1 was restored to the original value, thereby making possible the use of the apparatus.

Figure 23:
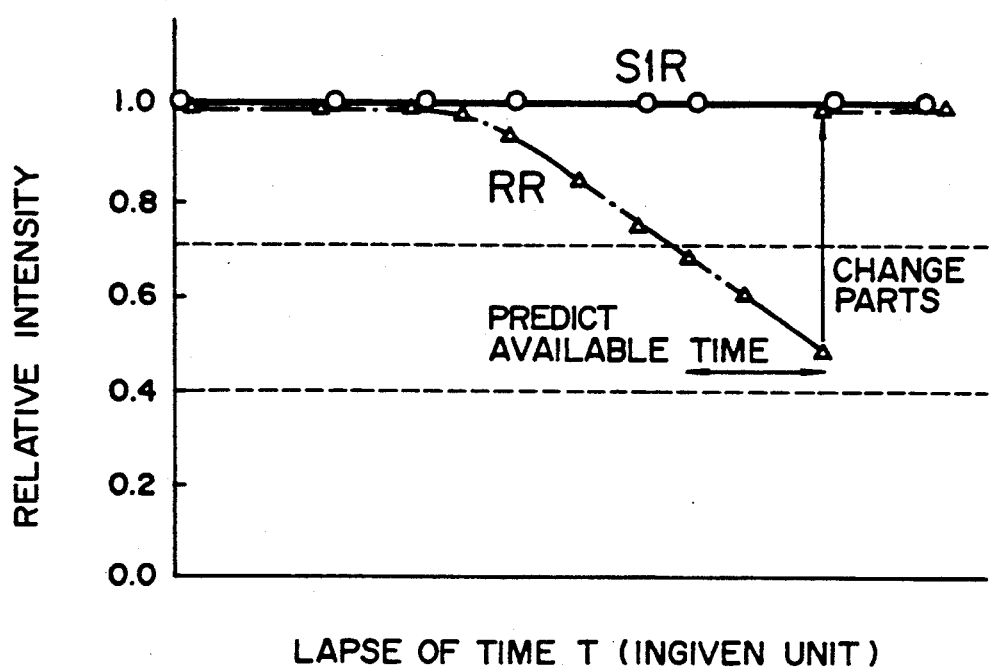
FIG. 23 is a graph showing another example of the output result of a circuit for monitoring the height measuring instrument according to the fifth embodiment.

FIG. 23 shows another case of operation. In this case, the relative illumination intensity S1R remained constant while the change in relative intensity ratio RR decreased This was considered attributable to the deterioration of the position sensor, and the particular sensor was replaced. Nevertheless, the fact remained unimproved. The inventors then decided that the real cause would be a signal deterioration due to a fouled light path. The replacement of the light paths 212, 214 which are located in the specimen chamber 209 requires a great labor for demounting the column and other jobs. The usable time was predicted from the RR inclination. Since the apparatus was found usable to the tie of the next regular inspection, the pattern-drawing process was continued to the next regular inspection, when the light paths were replaced. If the monitor circuit according to the present invention had not been prepared, the light paths would not have been replaced at the time of regular inspection. The result would have been that a height measurement error attributable to a fouled light path causing R smaller than 0.4 occurred immediately after the regular inspection, thereby necessitating an overhaul of the apparatus for the second time.

As explained above, the monitor function according to the present embodiment permits prediction of an accident, and therefore an abrupt apparatus fault is avoided, thus preventing a great loss. At the same time, a high availability factor is realized.

Embodiment 6

This embodiment is intended to accurately measure the height of a part irradiated with an electron beam on a wafer, regardless of the wafer position or style.

Figure 24:
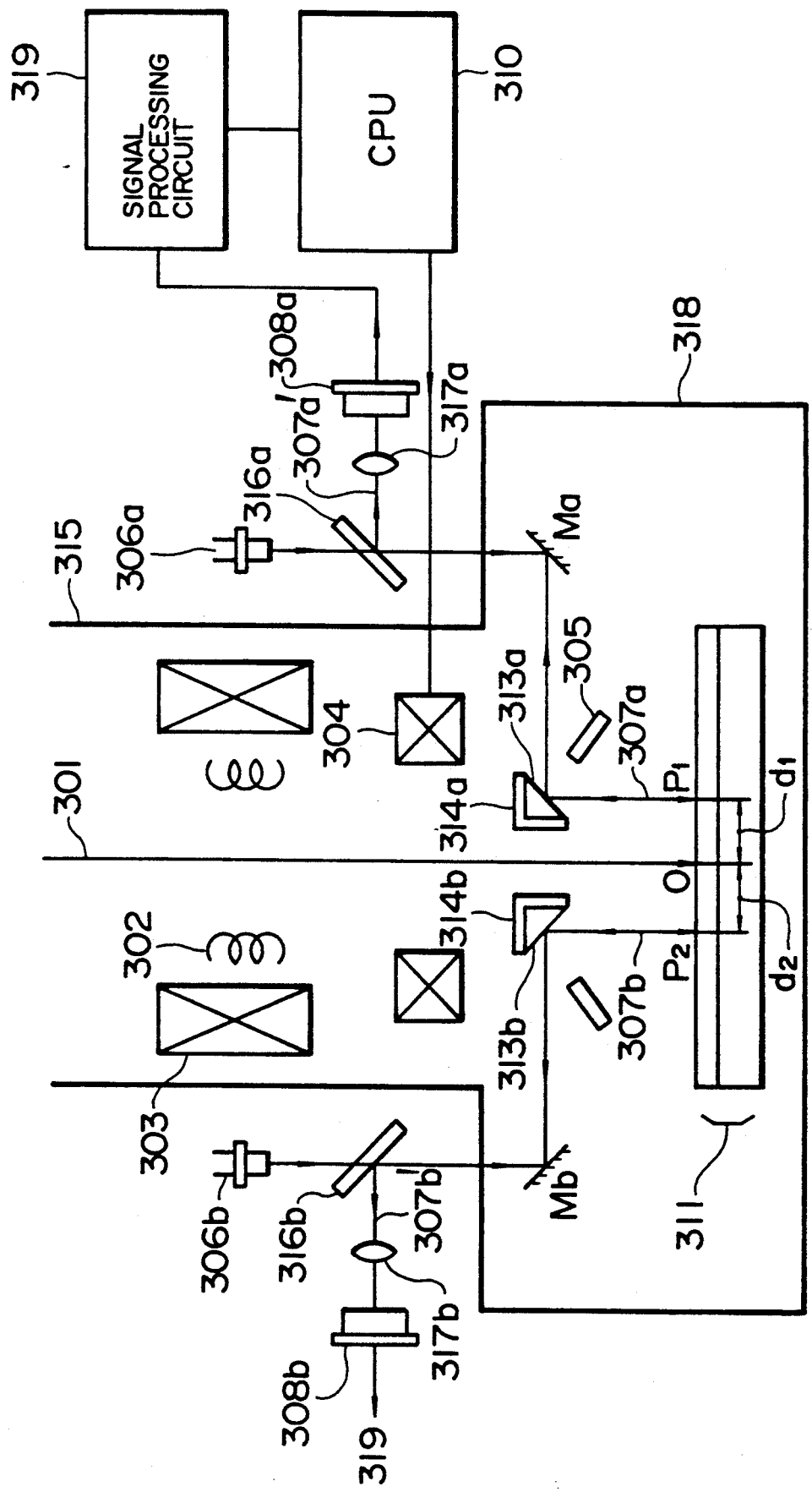
FIG. 24 is a diagram showing a configuration of an electron beam machine according to the sixth embodiment.

FIG. 24 shows a configuration of an electron beam apparatus according to the present embodiment. In a column 315 held in vacuum in its entirety, an electron beam 301 emitted from an electron beam source is scanned in the directions along X and Y planes by a deflection coil 302 while being converged on a specimen 311 by an objective lens 303 thereby to form various patterns. A reflected electron detector 305 is used for detecting the electrons reflected from a mark on the specimen 311 to draw a pattern while registering a position.

Figure 26:
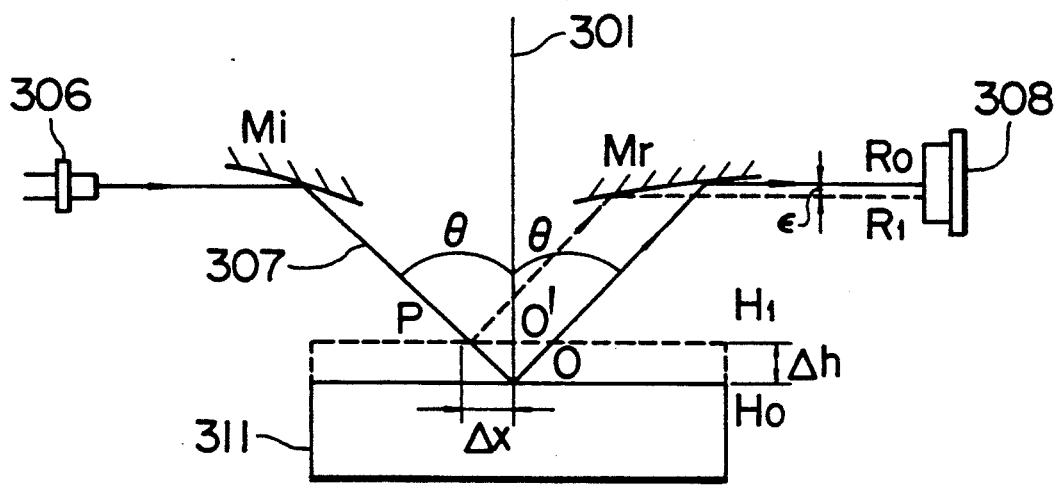
FIG. 26 is a diagram showing a configuration of a conventional height measuring instrument.

A conventional electron beam machine having a configuration as mentioned above includes a height measuring apparatus shown in FIG. 26. The light issued from a laser beam source 306 is applied to the surface of a specimen 311 at an angle $\theta$ of incidence, after which such displacements as the shape, position and magnitude of the reflected light are detected by a detector 308 under the effect of warping or the like of the specimen surface. This height information is fed back to a DF (dynamic focus) coil 304 through a signal processing circuit 319 and a CPU 310, so that the convergence of the electron beam 301 on the specimen surface is corrected properly.

The problem of this conventional apparatus will be described. The irradiation position 0 of the electron beam 301 on the surface of the specimen 311 coincides with that of the laser beam 307 irradiated at an angle $\theta$ of incidence from the laser beam source 306 at a reference position $H_0$ shown in the drawing, and the reference position of the reflected light $R_0$ associated with this situation is stored in memory through the detector 308. In the case where the surface of the specimen 311 is raised to $H_1$ by $\Delta h$ by warping or the like as illustrated, however, the position of irradiation of the electron beam 301 is moved to point 0' just above the original position, while the laser beam 307 advances along dashed line after reflection at point P of the surface of the specimen 311 and, causing a displacement $\epsilon$, is detected as a reflected light beam $R_1$. Characters Mi and Mr designate reflectors respectively. In such a case, a position shifted by $\Delta x$ from point 0' must be measured very inconveniently for point P. When $\theta \geq 45°$ ($\theta$ may be greater than 45° depending on the apparatus), $\Delta x = \Delta h \tan\theta \geq 100$ $\mu$m if $\Delta h = 100$ $\mu$m. The value $\Delta x$ represents a much greater warping by thermal deformation due to the manufacturing processes if the specimen is increased in size.

Now, let us return to the embodiment under consideration.

In FIG. 24, an electron beam 301 is irradiated at the point 0 on the surface of the specimen 311 at right angles thereto. The laser beam emitted from a right laser beam source 306a on the atmosphere side of a column 315 is passed through a half mirror 316a, led through the upper window into the interior of the specimen chamber 318 held in vacuum in its entirety, bent at right angles by reflectors Ma and 313a, and irradiated toward the specimen 311. The reflector 313a, except for the light-reflecting surface thereof, is subjected to conductive treatment by a conductive cover 314a not to cause any charging by the electron beam 301. This is also the case exactly with the left reflector 313b. The right laser beam 307a, which is parallel to the electron beam 301, is reflected in the opposite direction through the same light path after reaching a point $P_1$ on the specimen 311. The left laser beam source 306b of the column 315, on the other hand, is operated at the same time and is reflected at point $P_2$ of the specimen 311. More specifically, the points $P_1$ and $P_2$ reached by the two laser beams on the specimen surface are arranged on the same straight line in such a position as to hold the electron beam 1 therebetween. In this case, the distances from $P_1$ and $P_2$ from the irradiation point 0 of the electron beam 301 hole the relation $d_1 = d_2$. These figures are desirably set in a magnitude well within the size of an LSI chip in the order of several millimeters.

The reflected light is passed through the original light path, and after being reflected on the reflectors 313a and Ma, or 313b and Mb, is bent at right angles thereto by a half mirror 316a or 316b outside the column 315, so that an image of the reflected spot light thereof is formed on a detector 308a or 308b by a lens 317a or 317b. The height of the specimen 311, which may undergo a change, is determined by the change in shape and intensity of the laser beam 307a' or 307b' of which an image is formed. At the next step, the height information signal subjected to optoelectric conversion produced from the detectors is averaged out in the signal processing circuit 319. In view of the fact that the two laser beam irradiation points $P_1$ and $P_2$ are near to the irradiation position 0 of the electron beam 301, this height signal output faithfully reflects the height just under the electron beam. The resulting output is fed back to the DF coil 304 through the CPU 310 as in the case of FIG. 26, and thereby corrects the convergence of the electron beam 301. In this manner, the right pattern or the like is formed on the specimen 311.

Figure 25:
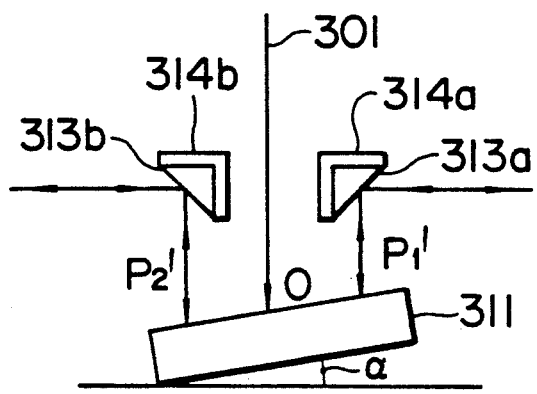
FIG. 25 is a diagram showing a part of the light paths of laser beams.

Also in the case where the specimen surface is tilted by an angle of $\alpha$ to the horizontal plane, the height of the point 0 just under the electron beam 301 is accurately given by the average of the heights of irradiation points $P_1'$ and $P_2'$ of the two parallel laser beams as shown in FIG. 25.

Although explanation was made above with reference to FIG. 24 about the case in which the two laser beam irradiation points $P_1$ and $P_2$ have exactly the same distance from the irradiation point 0 of the electron beam 301, the two distances may be somewhat different at the sacrifice of a considerably small accuracy.

It will thus be understood from the foregoing description that according to the present embodiment, there is provided an electron beam machine which is capable of accurately measuring the height of an electron beam used for processing, by averaging the reflected light signals of at least two laser beams which may be irradiated in parallel to the electron beam in the vicinity thereof Also, in spite of the fact that the foregoing explanation refers to the case in which the irradiation positions of the electron beam and the two laser beams are arranged on the straight line, three or four laser beams may be irradiated at the same time since one LSI chip actually has an area of about ten-odd mm square.

Figure 27:
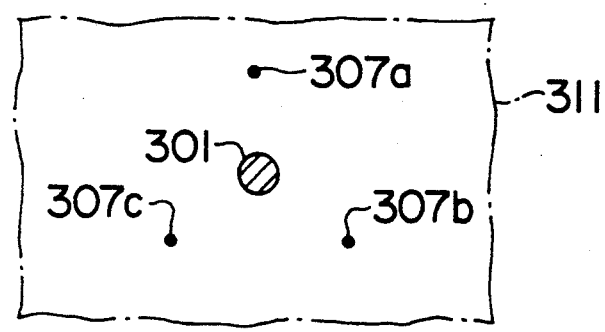
FIG. 27 and 28 are diagrams showing the relation of positions of irradiation between a laser beam and an electron beam.
Figure 28:
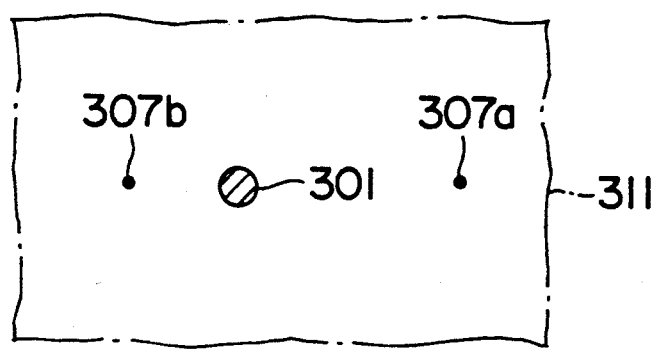

FIGS. 27 and 28 show cases in which the positions of irradiation of the electron beam and the laser beams hold other relations. In FIG. 27, the irradiation positions of three laser beams 307a, 307b and 307c are assumed to be located at the apexes of a hypothetical equilateral triangle, and the electron beam 301 is assumed to be irradiated at the center of the triangle. In FIG. 28, on the other hand, the distance between the irradiation position of the laser beam 307b and that of the electron beam 301 is about one half that between the laser beam 307a and the electron beam 301.

In all the cases described above with reference to the diagrams, the height of the electron beam irradiation positions can be determined by mathematically processing the wafer height obtained from each laser beam.

Although the present invention has been described in detail, it should be understood that various changes, substitutions and alternations can be made hereto without departing from the spirit and scope of the present invention as defined by the appended claims.

We claim:

1. A lithographic apparatus comprising:
   means for generating a lithographic beam;
   means for irradiating the beam on an object of lithography;
   means for holding the object;
   means for irradiating a first light beam on the object;
   means for irradiating a second light beam on the object; and
   means for controlling the lithographic beam by using at least one of the first and second beams reflected on the object.

2. A lithographic apparatus comprising:

means for generating a lithographic beam;
means for irradiating the beam on an object of lithography;
means for holding the object;
means for irradiating a first light beam on the object;
means for irradiating a second light beam on the object;
means for determining the position of the object by use of at least one of the first and second light beams reflected on the object; and
means for controlling the lithographic beam on the basis of the determined position of the object.

3. A lithographic apparatus according to claim 2, wherein the determined position is along the direction of irradiation of the lithographic beam.

4. An apparatus for measuring the position of an object of lithography for a lithographic apparatus, comprising:
means for irradiating a first light beam on the object;
means for irradiating a second light beam on the object; and
means for determining the position of the object by use of at least one of the first and second light beams reflected from the object.

5. A lithographic apparatus according to claim 1, wherein the first and second light beams are monochromatic light beams having different wavelengths from each other thereby to eliminate the effect of the resist formed on the surface of the object.

6. A lithographic apparatus according to claim 5, wherein the wavelength of the first monochromatic light beam is approximately half that of the second monochromatic light beam.

7. A lithographic apparatus according to claim 1, wherein the first and second light beams are applied to the object at different angles of incidence from each other thereby to eliminate the effect of the resist formed on the surface of the object.

8. A lithographic apparatus according to claim 1, wherein the first and second light beams are passed along different light paths from each other, and are applied to the same part of the object from directions substantially at right angles to each other thereby to eliminate the effect of the pattern formed on the object.

9. A lithographic apparatus according to claim 1, wherein said lithographic beam is an electron beam.

10. A lithographic apparatus according to claim 9, wherein said irradiation means includes means for converging the electron beam and means for deflecting the electron beam, and
said control means regulates the deflection of the electron beam by use of at least one of the first and second light beams reflected on the object.

11. A lithographic apparatus according to claim 1, wherein said lithographic beam is an ultraviolet light beam.

12. A lithographic apparatus according to claim 11, wherein said irradiation means includes means for converging the ultraviolet light beam, and
said control means regulates the focal point of the ultraviolet light beam by use of at least one of the first and second light beams reflected on the object.

13. A method of forming a predetermined pattern on an object of lithography by irradiating a lithographic beam on the object, comprising the steps of:
activating means for irradiating the lithographic beam on the object on the basis of a first data corresponding to the predetermined pattern;
irradiating a first light beam on the object;
irradiating a second light beam on the object; and
correcting the first data by use of at least one of the first and second light beams reflected on the object thereby to regulate the irradiation of the lithographic beam.

14. A method of forming a predetermined pattern on an object of lithography by irradiating a lithographic beam on the object, comprising the steps of:
activating means for irradiating the lithographic beam on the object on the basis of a first data corresponding to the predetermined pattern;
irradiating a first light beam on the object;
irradiating a second light beam on the object;
determining the position of the object by use of at least one of the first and second light beams reflected on the object; and
correcting the first data on the basis of the determined position of the object thereby to regulate the irradiation of the lithographic beam.

15. A method of measuring the position of an object of lithography for a lithographic apparatus, comprising the steps of:
irradiating a first light beam on the object;
irradiating a second light beam on the object; and
determining the position of the object by use of at least one of the first and second light beams reflected on the object.

16. An apparatus for subjecting an object including a resist layer to lithography, comprising:
means for generating a lithographic beam;
means for irradiating the lithographic beam on the object;
means for holding the object;
means for irradiating a P-polarized inspection light beam on the object at an angle of Brewster, thereby causing substantially the whole inspection light beam to pass through the resist layer on the object and be reflected on the surface of the object; and
means for controlling the lithographic beam by use of the light beam reflected on the object.

17. An apparatus for subjecting an object including a resist layer to lithography, comprising:
means for generating a lithographic beam;
means for irradiating the lithographic beam on the object of lithography;
means for holding the object;
means for irradiating a P-polarized inspection light beam on the object at an angle of Brewster, thereby causing substantially the whole inspection light beam to pass through the resist layer on the object and be reflected on the surface of the object;
means for determining the surface position of the object by use of the light beam reflected on the object; and
means for controlling the lithographic beam on the basis of the determined position of the object.

18. A lithographic apparatus according to claim 17, wherein said means for determining the position has stored therein a data on the thickness of the resist layer and compares the data obtained from the reflected light beam with the data on the thickness of the resist layer thereby to determine the surface position of the object.

19. A lithographic apparatus according to claim 18, wherein the data obtained from the reflected light beam represents a surface position of the resist layer by the refraction of the light beam reflected on the resist layer.

20. A lithographic apparatus according to claim 17, wherein the determined position represents a position in the direction of irradiation of the lithographic beam.

21. An apparatus for measuring the position of an object of lithography for a lithographic apparatus, comprising:
   means for irradiating a P-polarized inspection light beam on the object at an angle of Brewster, thereby causing substantially the whole inspection light beam to pass through the resist layer on the object and be reflected on the object; and
   means for determining the position of the object by use of the light beam reflected on the object.

22. A method of forming a predetermined pattern on an object of lithography having a resist layer by irradiating a lithographic beam thereon, comprising the steps of:
   activating means for irradiating the lithographic beam on the object on the basis of a first data corresponding to the predetermined pattern;
   irradiating a P-polarized inspection light beam on the object at an angle of Brewster, thereby causing substantially the whole of the inspection light beam to pass through the resist layer on the object and be reflected on the surface of the object; and
   controlling the lithographic beam by use of the light beam reflected on the object.

23. A method of forming a predetermined pattern on an object of lithography having a resist layer by irradiating a lithographic beam thereon, comprising the steps of:
   activating means for irradiating the lithographic beam on the object on the basis of a first data corresponding to the predetermined pattern;
   irradiating a P-polarized inspection light beam on the object at an angle of Brewster, thereby causing substantially the whole of the inspection light beam to pass through the resist layer on the object and be reflected on the surface of the object;
   determining the position of the object by use of the inspection light beam reflected on the object; and
   controlling the lithographic beam on the basis of the determined position of the object.

24. A method of measuring the position of an object of lithography having a resist layer for a lithographic apparatus, comprising the steps of:
   irradiating a P-polarized inspection light beam on the object at an angle of Brewster, thereby causing substantially the whole of the inspection light beam to pass through the resist layer and be reflected on the surface of the object; and
   controlling the lithographic beam by use of the inspection light beam reflected on the object.

25. A lithographic apparatus according to claim 1, wherein the first and second light beams are applied to different parts of the object from each other.

26. A lithographic apparatus according to claim 25, wherein:
   the first light beam is irradiated on a region of the object having an alignment mark;
   the second light beam is irradiated on a region of the object having a pattern; and said control means includes means for determining the position of the region having an alignment mark from the reflected first light beam and means for determining the position of the region having a pattern from the reflected second light beam, the lithographic beam being controlled on the basis of the difference between the two positions.

27. A lithographic apparatus comprising:
   means for generating a lithographic beam;
   means for irradiating the lithographic beam on an object of lithography;
   means for holding the object;
   a chamber for isolating the object from the external environment;
   means for detecting a signal from the object; and
   means for holding the detection means in the chamber, said holding means being supported at the ends thereof against the chamber.

28. A lithographic apparatus according to claim 27, further comprising means for processing the signal produced from the detection means, said processing means being also held by the holding means.

29. A lithographic apparatus according to claim 28, wherein the detection means and the processing means are incorporated in the holding means.

30. A lithographic apparatus according to claim 27, further comprising means for irradiating the object with a light beam for detecting the height thereof, said detection means detecting said light beam as reflected.

31. A lithographic apparatus according to claim 30, wherein said lithographic beam is an electron beam and said detection means is a detector of selected one of reflected and secondary electrons.

32. A lithographic apparatus according to claim 27, further comprising first support means for supporting an end of the holding means and second support means for supporting the other end of the holding means.

33. A lithographic apparatus according to claim 32, wherein the first support means is mounted on the side wall of the chamber and the second support means is mounted on the upper wall of the chamber.

34. A lithographic apparatus according to claim 32, wherein the first and second support means are mounted on the opposite side walls of the chamber.

35. A lithographic apparatus according to claim 27, wherein said side walls of the chamber have a window formed therein for accessing the holding means.

36. A lithographic apparatus according to claim 27, wherein the lithographic beam is an ultraviolet ray.

37. An apparatus for measuring the position of an object of lithography as applied to a lithographic apparatus, comprising:
   means including light-emitting means for irradiating a light beam on the object;
   means including the light-receiving means for receiving the light beam reflected on the object and determining the position of the object by use of the result of receiving the light beam; and
   means for monitoring at least one of the intensity of the light beam emitted from the light-emitting means and the intensity of the light beam received by the light-receiving means.

38. A position-measuring apparatus according to claim 37, further comprising:
   means for deciding on the operating condition of the measuring apparatus, i.e., whether the measuring apparatus operates in normal fashion, by use of the result of monitoring; and means for displaying the result of decision.

39. A lithographic apparatus comprising:
means for irradiating the lithographic beam on an object of lithography;
means for holding the object;
means including light-emitting mean for irradiating the light beam on the object;
means including the light-receiving means for receiving the light beam reflected on the object and determining the position of the object by use of the result of receiving the light beam; and
means for monitoring at least one of the intensity of the light beam emitted from the light-emitting means and the intensity of the light beam received by the light-receiving means.

40. A lithographic apparatus according to claim 39, further comprising means for deciding on the operating condition of the measuring apparatus, i.e., whether the measuring apparatus operates in normal fashion, by use of the result of monitoring.

41. A lithographic apparatus according to claim 40, further comprising means for displaying the result of decision by the decision means.

42. A lithographic apparatus according to claim 40, further comprising means for controlling the irradiation of the lithographic beam by use of the result of decision by the decision means.

43. A method of deciding on the operating condition of an apparatus for measuring the position of an object of lithography as applied to a lithographic apparatus, said measuring apparatus including means having light-emitting means for irradiating a light beam on the object, light-receiving means for receiving the light beam reflected on the object, and means for determining the position of the object by use of the result of receiving the light beam, said method comprising the steps of:
monitoring at least one of the intensity of the light beam emitted from the light-emitting mean and the intensity of the light beam received by the light-receiving means; and
deciding on the operating condition of the measuring apparatus on the basis of the result of monitoring.

44. A method of decision according to claim 43, wherein:
said decision step further includes the substeps of determining the secular variation (S1R) of the intensity of the emitted light beam, the secular variation (S2R) of the intensity of the received light beam and the secular variation (RR) of the ratio between the intensities of the emitted and received light beams, and comparing each of said values with a predetermined threshold value respectively, thereby deciding on the operating condition of the measuring apparatus.

45. A lithographic apparatus comprising:
means for generating a lithographic beam;
means for irradiating the lithographic beam on an object of lithography;
means for holding the object;
means for irradiating a plurality of light beams substantially parallel to the lithographic beam on the object; and
means for controlling the lithographic beam on the basis of the light beams reflected on the object and the relationship between the positions of irradiation of the light beams and the lithographic beam.

46. A lithographic apparatus comprising:
means for generating a lithographic beam;
means for irradiating the lithographic beam on an object of lithography;
means for holding the object;
means for irradiating a plurality of light beams substantially parallel to the lithographic beam on the object;
means for determining the position of the object from the light beams reflected on the object and the relationship between the positions of the light beams and the lithographic beam; and
means for controlling the lithographic beam on the basis of the determined position of the object.

47. A lithographic apparatus according to claim 46, wherein the determined position is in the direction of irradiation of the lithographic beam.

48. An apparatus for measuring the position of an object of lithography for a lithographic apparatus, comprising:
means for irradiating a plurality of light beams substantially parallel to the lithographic beam on the object;
means for determining the position of the object from the light beams reflected on the object and the relationship between the positions of the light beams and the lithographic beam; and
means for controlling the lithographic beam on the basis of the determined position of the object.

49. A lithographic apparatus according to claim 46, wherein the relationship between the positions of the light beams and the lithographic beam is such that the position of irradiation of the lithographic beam is located at a hypothetical center of gravity of the irradiation position of the light beams.

50. A lithographic apparatus according to claim 49, wherein the light beams include first and second light beams, and the irradiation position of the lithographic beam is substantially at the center of the irradiation positions of the first and second light beams.

51. A lithographic apparatus according to claim 46, wherein the light beams are laser beams.

52. A lithographic apparatus according to claim 51, wherein the outer diameter of the laser beams on the object is not more than 100 microns.

53. A method of forming a predetermined pattern on an object of lithography by irradiating a lithographic beam thereon, comprising the steps of:
activating means for irradiating the lithographic beam on the object on the basis of a first data corresponding to the predetermined pattern;
irradiating a plurality of light beams substantially parallel to the lithographic beam on the object; and
controlling the lithographic beam on the basis of the light beams and the relationship between the positions of the light beams and the lithographic beam.

54. A method of forming a predetermined pattern on an object of lithography by irradiating a lithographic beam thereon, comprising the steps of:
activating means for irradiating the lithographic beam on the object on the basis of a first data corresponding to the predetermined pattern;
irradiating a plurality of light beams substantially parallel to the lithographic beam on the object;
determining the position of the object on the basis of the light beams reflected on the object and the relationship between the positions of the light beams and the lithographic beam; and correcting the first data on the basis of the determined position of the object thereby to regulate the irradiation of the lithographic beam.

55. A method of measuring the position of an object of lithography for a lithographic apparatus, comprising the steps of:

irradiating a plurality of light beams substantially parallel to the lithographic beam on the object; and determining the position of the object on the basis of the light beams reflected on the object and the relationship between the positions of the light beams and the lithographic beam.

* * * * *